US010479905B2

(12) United States Patent
Hersam et al.

(10) Patent No.: US 10,479,905 B2
(45) Date of Patent: *Nov. 19, 2019

(54) HIGH-RESOLUTION PATTERNING OF GRAPHENE BY SCREEN AND GRAVURE PRINTING FOR HIGHLY FLEXIBLE PRINTED ELECTRONICS

(71) Applicants: Northwestern University, Evanston, IL (US); Regents of the University of Minnesota, Minneapolis, MN (US)

(72) Inventors: Mark C. Hersam, Wilmette, IL (US); Ethan B. Secor, Evanston, IL (US); Sooman Lim, Gyeongsan-si (KR); C. Daniel Frisbie, Mahtomedi, MN (US); Lorraine F. Francis, Minnetonka, MN (US); Woo Jin Hyun, St. Paul, MN (US)

(73) Assignees: NORTHWESTERN UNIVERSITY, Evanston, IL (US); REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/836,310

(22) Filed: Dec. 8, 2017

(65) Prior Publication Data

US 2018/0100080 A1      Apr. 12, 2018

Related U.S. Application Data

(62) Division of application No. 14/699,822, filed on Apr. 29, 2015, now Pat. No. 9,840,634.

(60) Provisional application No. 62/076,233, filed on Nov. 6, 2014, provisional application No. 61/985,914, filed on Apr. 29, 2014.

(51) Int. Cl.
| G03F 7/12 | (2006.01) |
| C09D 11/52 | (2014.01) |
| C09D 11/033 | (2014.01) |
| C09D 11/037 | (2014.01) |

(52) U.S. Cl.
CPC ............ C09D 11/52 (2013.01); C09D 11/033 (2013.01); C09D 11/037 (2013.01); G03F 7/12 (2013.01)

(58) Field of Classification Search
None
See application file for complete search history.

(56) References Cited

U.S. PATENT DOCUMENTS

| 9,079,764 | B1 * | 7/2015 | Hersam | ................ C09D 101/28 |
| 2010/0000441 | A1 | 1/2010 | Jang et al. | |
| 2010/0239871 | A1 * | 9/2010 | Scheffer | .................. H01B 1/24 |
| | | | | 428/447 |

(Continued)

OTHER PUBLICATIONS

Liang, Y.T. et al., "Highly Concentrated Graphene Solutions via Polymer Enhanced Solvent Exfoliation and Iterative Solvent Exchange", Journal of the American Chemical Society, 2010, vol. 132, No. 50, 17661-17663.

(Continued)

*Primary Examiner* — Chanceity N Robinson
(74) *Attorney, Agent, or Firm* — Locke Lord LLP; Tim Tingkang Xia, Esq.

(57) ABSTRACT

Graphene ink compositions as can be utilized with gravure and screen printing processes, to provide flexible electronic components with high-resolution printed graphene circuitry.

14 Claims, 20 Drawing Sheets

(56) References Cited

U.S. PATENT DOCUMENTS

Figure 3A:
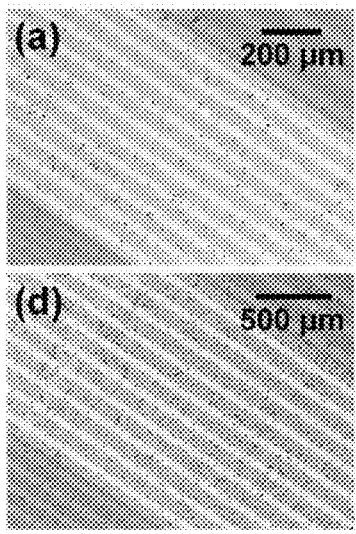
Figure 3B:
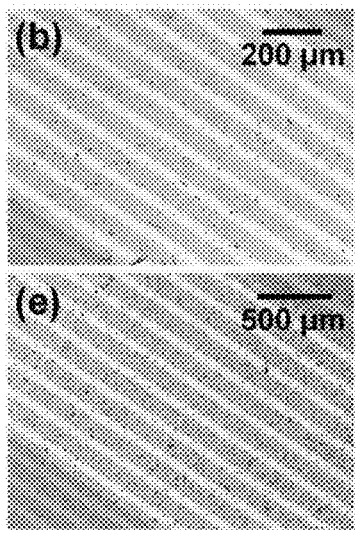
Figure 3C:
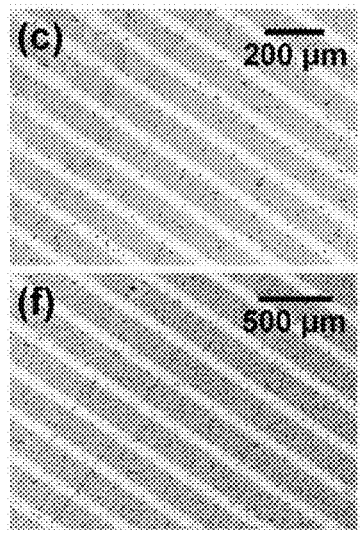
Figure 3D:
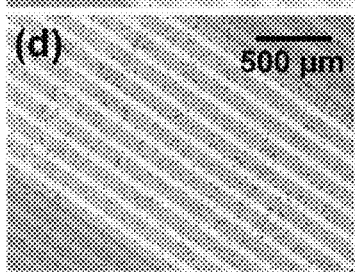
Figure 3E:
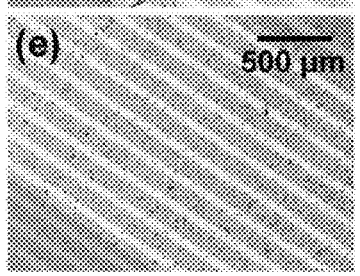
Figure 3F:
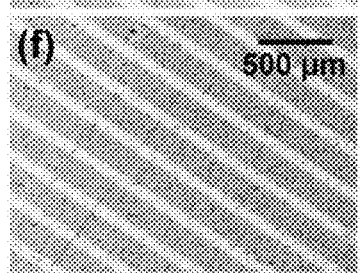

2013/0184144 A1 7/2013 Liang et al.
2015/0315398 A1 11/2015 Hersam et al.
2016/0276056 A1* 9/2016 Stolyarov ............... H01B 1/04

OTHER PUBLICATIONS

Secor, E. et al., "Inkjet printing of high conductivity, flexible graphene patterns", The Journal of Physical Chemistry Letters, 2013, vol. 4, No. 8, 1347-1351.
Caglar, U., "Studies of Inkjet Printing Technology with Focus on Electronic Materials", Thesis for the degree of Doctor of Tampere University of Technology, 2009, Publication 863, 1-69.

\* cited by examiner

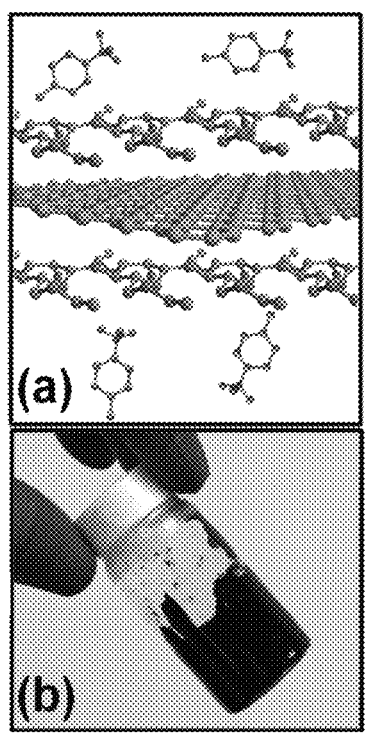
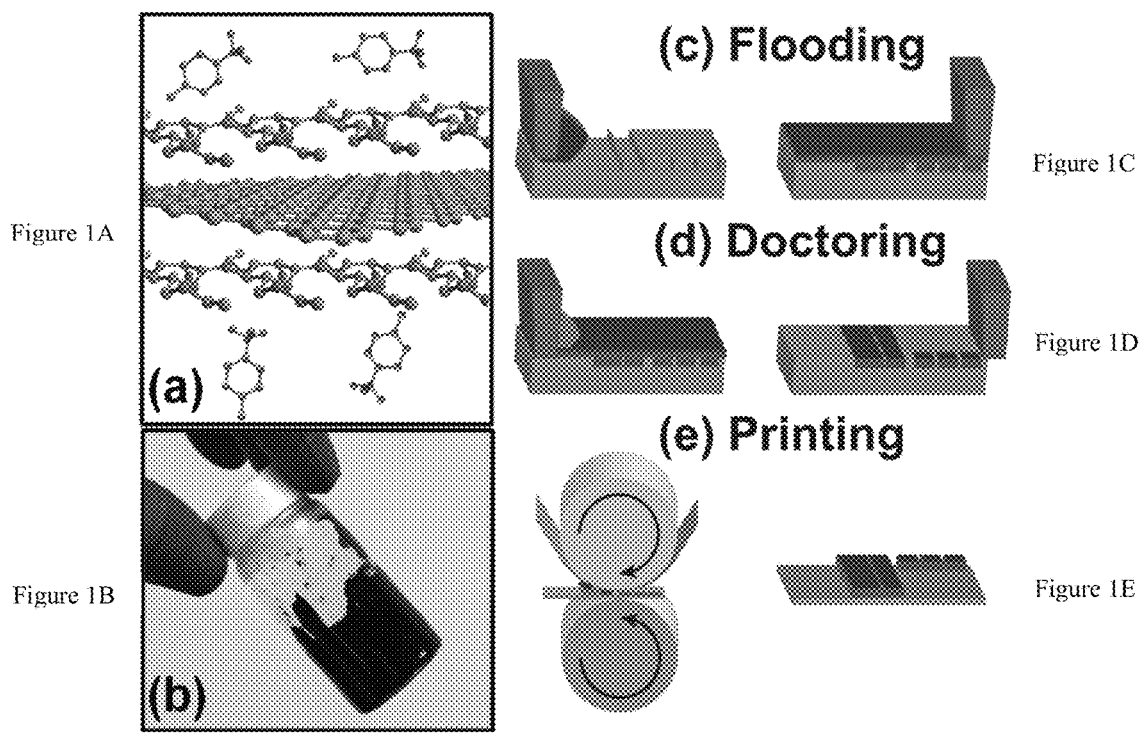
Figure 1A
Figure 1B
Figure 1C
Figure 1D
Figure 1E

Figure 2A
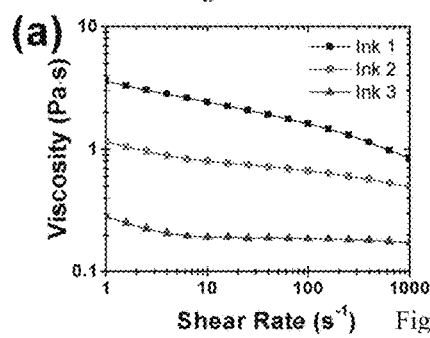
Figure 2B
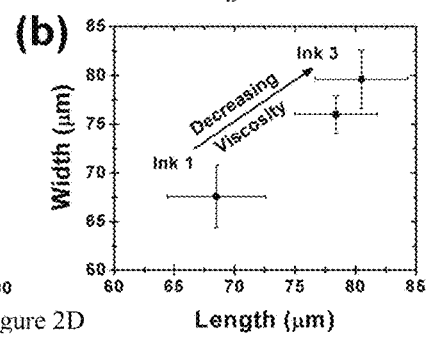
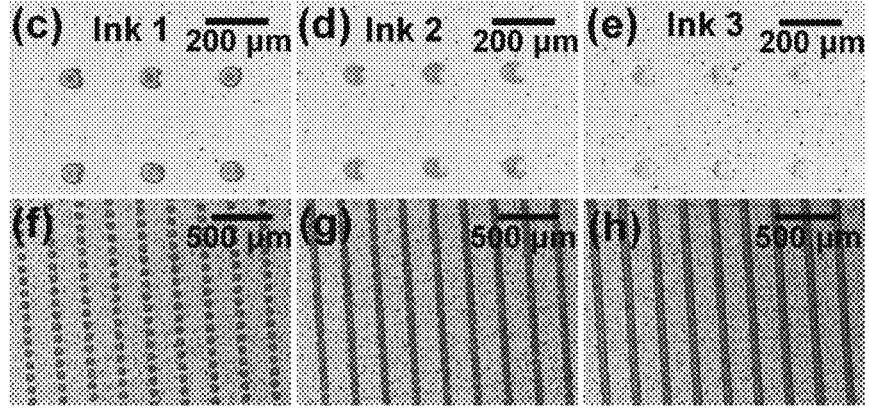
Figure 2C     Figure 2D     Figure 2E
Figure 2F     Figure 2G     Figure 2H

Figures 12B-E

Figure 15A 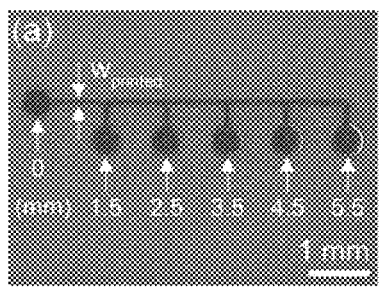 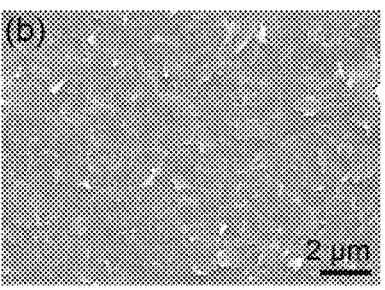 Figure 15B
Figure 15C 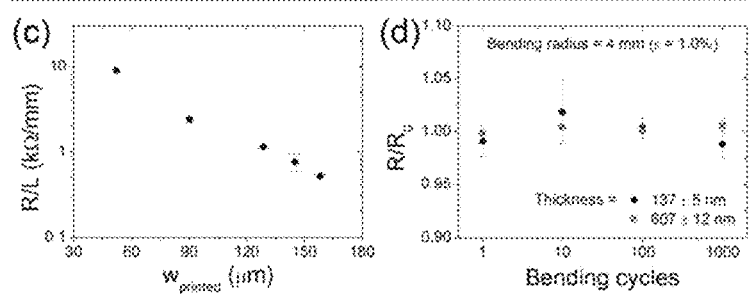 Figure 15D

Figure 18D

Figure 22A
Figure 22B
Figure 22C
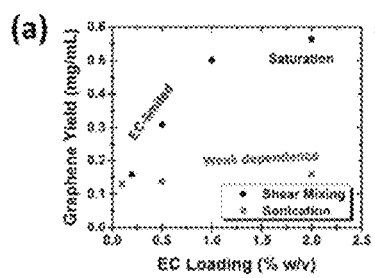
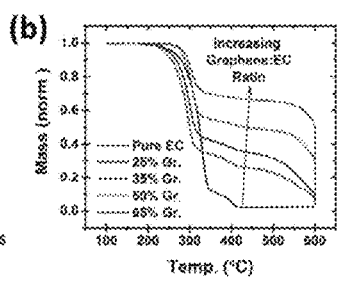
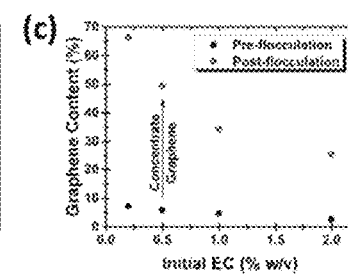
Figure 23A
Figure 23B
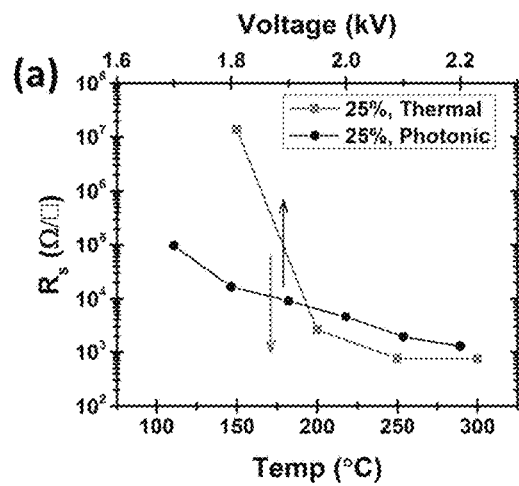
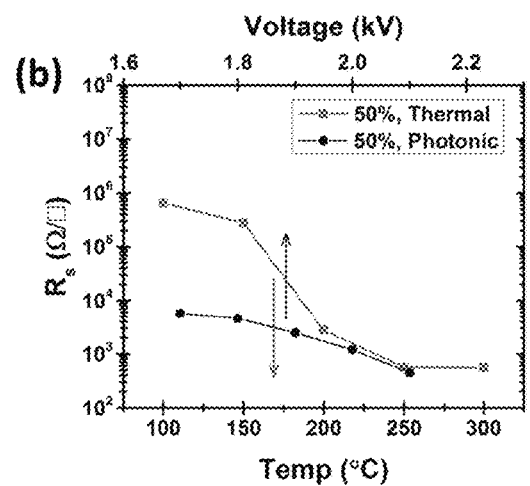

HIGH-RESOLUTION PATTERNING OF GRAPHENE BY SCREEN AND GRAVURE PRINTING FOR HIGHLY FLEXIBLE PRINTED ELECTRONICS

This application is a divisional of and claims priority to and the benefit of application Ser. No. 14/699,822 filed Apr. 29, 2015 and issued as U.S. Pat. No. 9,840,634 on Dec. 12, 2017, which claimed priority to and the benefit of application Ser. No. 61/985,914 filed Apr. 29, 2014 and application Ser. No. 62/076,233 filed Nov. 6, 2014—each of which is incorporated herein by reference in its entirety.

This invention was made with government support under N00014-11-1-0690 awarded by the Office of Naval Research and DMR-1121262 awarded by the National Science Foundation. The government has certain rights in the invention.

BACKGROUND OF THE INVENTION

Graphene, the two-dimensional, $sp^2$-bonded allotrope of carbon, has attracted significant interest for a wide variety of applications. While a number of methods exist for the production of graphene, solution-phase exfoliation is well-suited for low-cost, large-volume applications such as printed electronics. For these applications, a stable, high-concentration dispersion of graphene in suitable solvents is of critical importance. Although reduced graphene oxide can meet this criterion, the degradation of the material during oxidation and often harsh processing steps required for reduction motivates the use of pristine graphene. The dispersion of pristine graphene typically requires select organic solvents, surfactants, or polymer stabilizers to mitigate flake aggregation.

Printed and flexible electronics are a potentially disruptive technology, offering low-cost, large-area functional devices for novel applications in areas such as environmental and biological monitoring, energy harvesting and storage, flexible displays and radio frequency identification. Solvent-exfoliated graphene is particularly well-suited for this emerging field due to its high conductivity, excellent chemical and environmental stability, inherent flexibility, and low cost. Recent research has demonstrated inkjet printing of graphene for the fabrication of functional devices such as chemical and thermal sensors, acoustic actuators, dipole antennas, and thin film transistors. While inkjet printing offers an additive technique that is ideal for rapid prototyping in research laboratories, its limited throughput motivates the development of alternative printing strategies for industrial-scale applications. Gravure printing is a promising option in this regard since it offers high-speed, roll-to-roll deposition of functional materials at high resolution.

Although several studies have demonstrated the utility of gravure printing for printed electronics, this technique has not yet been demonstrated for graphene. The absence of graphene in gravure printing can be attributed to the difficulty in formulating suitable inks since graphene possesses poor dispersion stability in common organic solvents. One strategy that enables graphene dispersions is to oxidatively exfoliate graphite, but this approach typically requires harsh chemical or thermal treatments and results in degradation of electrical properties. On the other hand, pristine graphene can be dispersed in select solvents such as N-methylpyrrolidone, but this system is unsuitable for gravure printing due to its low viscosity and limited graphene concentration. Accordingly, it remains an on-going concern in the art to develop an approach to and produce a graphene ink composition of the sort to better utilize the benefits and advantages associated with gravure printing techniques.

Screen printing is another promising approach for the practical integration of pristine graphene for applications in printed electronics. This technique is a classic mass-printing method, and is realized by pressing an ink through a patterned stencil with a squeegee. It has been widely employed for electronics because it is a versatile process, compatible with a wide variety of functional inks and substrates. Although several studies have demonstrated screen printing of reduced graphene oxide, high-resolution screen printing of pristine graphene for printed electronics has not yet been realized. This is due in part to the difficulty in producing highly loaded dispersions of pristine graphene resulting from the material's inherent tendency to aggregate. Moreover, conventional screen printing methods are restricted to a resolution of 75 to 150 μm, impeding the drive for fabrication of finer patterns to facilitate higher integration density and improved device performance. The resolution of screen printing is highly dependent on the quality of the stencil, which is generally prepared using a photochemically defined emulsion coated on a screen mesh. Although finer patterns of the stencil are expected to improve printing resolution, the low lithography resolution of the emulsion layer and mesh dimensions restricts the improvement in printing resolution. Thus, it is a challenge to develop a high-resolution stencil that can be applied to screen printing of graphene for printed electronics.

SUMMARY OF THE INVENTION

In light of the foregoing, it is an object of the present invention to provide graphene ink compositions, together with related methods of preparation, for gravure and screen printing, thereby overcoming various deficiencies and shortcomings of the prior art, including those outlined above. It will be understood by those skilled in the art that one or more aspects of this invention can meet certain objectives, while one or more aspects can meet certain other objectives. Each objective may not apply equally, in all its respects, to every aspect of this invention. As such, the following objects can be viewed in the alternative, with respect to any one aspect of this invention.

It can be an object of the present invention to provide an economical, efficient approach to the preparation of stable graphene solutions, dispersions and related graphene ink compositions, without resort to oxidized or chemically modified graphene, at concentrations sufficient, and surface tension and viscosity tunable, for a range of end-use applications, without compromising electrical characteristics.

It can also be an object of the present invention to provide a low temperature, environmentally benign approach to gravure graphene printing en route to the fabrication of high-conductivity patterns suitable for flexible or foldable electronics.

It can also be an object of the present invention to provide high resolution graphene screen printing, as compared to conventional lithographic methods of the prior art, en route to the fabrication of high-conductivity patterns suitable for flexible or foldable electronics.

It can also be an object of the present invention, alone or in conjunction with one or more of the preceding objectives, to provide a stencil component, useful in conjunction with the high resolution screen printing of graphene inks and methods for the preparation of such a stencil.

Other objects, features, benefits and advantages of the present invention will be apparent from the summary and the following descriptions of certain embodiments, and will be readily apparent to those skilled in the art having knowledge of graphene ink compositions and methods for gravure and screen printing such compositions. Such objects, features, benefits and advantages will be apparent from the above as taken into conjunction with the accompanying examples, data, figures and all reasonable inferences to be drawn therefrom.

Accordingly, the present invention can be directed to a composition comprising non-oxidized graphene, a hydrophobic fluid component and, optionally, a graphene dispersing/stabilizing agent, and/or a decomposition product thereof, at least partially soluble in such a hydrophobic fluid component. Without limitation, such a dispersing/stabilizing agent can comprise ethyl cellulose. In various embodiments, regardless of dispersing/stabilizing agent, such a hydrophobic fluid component can comprise a component selected from chloroform, $\sim C_6$-$\sim C_8$ and other alkanes, terpenes, terpene alcohols and combinations thereof, optionally together with one or more suitable dispersants. In certain such embodiments, such a hydrophobic fluid component can comprise a mixture of terpineol and, optionally, ethanol. Removal of ethanol provides a graphene ink of desired viscosity and solids concentration. Thermal or photonic annealing can at least partially remove and/or decompose residual ethyl cellulose to provide a corresponding graphene ink composition.

In certain embodiments, such an ink composition can comprise a solids concentration of about 5% w/v, about 6% w/v . . . up to about 10% w/v, . . . up to about 15% w/v, about 16% w/v . . . up to about 20% w/v or more in such a hydrophobic solvent, such a solids concentration as can comprise graphene and a cellulosic polymer. Without limitation, a solids concentration can be about 5 to about 10% w/v or more in such a solvent. Alternatively, a solids concentration can be up to about 15 to about 20% w/v or more. Regardless, graphene can be a component of a graphene-ethyl cellulose solute in such a hydrophobic solvent. In certain such embodiments, about 0.2 to about 1.5 g of graphene-ethyl cellulose in about 10 mL of such a solvent can provide a corresponding solids concentration. Regardless, such a solids and/or graphene concentration can provide such an ink composition with a viscosity from about 0.1, about 0.5 . . . up to about 1.0, about 5, . . . up to about 10 . . . up to about 50 . . . or up to about 100 Pa·s, or higher, at a shear rate of up to about 1,000 sec$^{-1}$. In certain embodiments, such a composition can be printed or patterned on a substrate and annealed, providing such a printed composition a graphene content of up to about 15 wt %, about 16 wt % . . . up to about 20 wt % . . . up to about 30 wt % . . . up to about 40 wt % . . . or up to about 50 wt % or more and a conductivity of greater than about $10^4$ S/m.

In part, the present invention can also be directed to a method of preparing a graphene ink composition. Such a method can comprise exfoliating graphene from a non-oxidized graphene source material with a medium comprising an organic solvent and a cellulosic polymer at least partially soluble in such an organic solvent; contacting at least a portion of such an exfoliated graphene medium with an aqueous medium to concentrate exfoliated graphene in a composition comprising graphene and such a cellulosic polymer; contacting such a graphene-cellulosic composition with a hydrophobic fluid comprising an ink solvent and a dispersion solvent; and removing such a dispersion solvent to provide a graphene ink composition comprising a solids concentration and a viscosity.

In certain embodiments, such an ink solvent can be selected from terpenes, terpene alcohols and combinations thereof. Independently, such a dispersion solvent can be selected from alcohols. Various other dispersion solvents will be known to those skilled in the art and made aware of this invention. More generally, choice of a dispersion solvent is limited only by functional capacity to facilitate dispersion of graphene and maintenance of a low dispersion viscosity, with removal at reasonably low temperatures to provide a graphene dispersion in a desired ink solvent. Likewise, besides terpineol(s), various other ink solvents will be known to those skilled in the art and made aware of this invention. More generally, choice of an ink solvent is limited only by sufficient miscibility with a dispersion solvent and functional capacity to maintain a stable graphene dispersion after removal of such a dispersion solvent. Regardless, such a hydrophobic fluid component can comprise a terpineol and ethanol.

Alternatively, such a method can comprise exfoliating graphene from a graphene source material with a medium comprising an organic solvent selected from ethanol and dimethylformamide, and an ethyl cellulose; contacting at least a portion of such an exfoliated graphene medium with an aqueous (e.g., without limitation, an aqueous NaCl solution) medium to concentrate exfoliated graphene and ethyl cellulose; and contacting such a graphene-cellulose composition with a hydrophobic fluid (e.g., without limitation, as can comprise an ink solvent such as terpineol and a dispersion solvent such as ethanol) component. A resulting graphene ink composition of the sort described above can be applied to, deposited and/or gravure or screen printed on a suitable substrate then annealed.

In certain non-limiting embodiments, a resulting non-oxidized graphene ink composition can have a solids concentration of about 5 to about 10% w/v, and a viscosity of about 0.1 to about 1.0 Pa·s. Such a composition can be gravure printed on a substrate, with a resulting graphene content of about 30 to about 40 wt %. Alternatively, in certain other non-limiting embodiments, such an ink composition can have a solids concentration of about 10 to about 20% w/v, and a viscosity of about 5 to about 100 Pa·s. Such a composition can be screen printed on a substrate, with a resulting graphene content of at least about 50 wt %.

In part, this invention can also be directed to a method of preparing a silicon screen printing stencil. Such a method can comprise providing a silicon wafer comprising a thickness dimension of about 120 μm or less, such a dimension providing such a wafer mechanical flexibility sufficient for screen printing; applying a photoresist composition to such a wafer; contacting such a photoresistive wafer with a photomask comprising a pattern of openings therethrough; exposing such a photoresistive composition to UV light in a pattern defined by such a photomask; removing such a mask and etching such a wafer to provide a pattern of openings therethrough; and removing such a photoresist composition to provide a silicon screen printing stencil. In certain embodiments, reactive ion etching can be employed to provide a pattern of openings through such a stencil. Regardless, wafer and resulting stencil thickness dimension can be about 85 μm to about 120 μm. Without limitation as to wafer/stencil dimension, such a photomask and a resulting stencil pattern can comprise line openings having a width dimension of about 5 μm to about 40 μm.

In part, the present invention can also be directed to method of printing such a graphene ink composition. Such a method can comprise providing a graphene ink composition selected from compositions of the sort discussed above or described elsewhere herein; and printing such a composition on a substrate. Such printing can comprise placing such an ink composition on a print pattern; contacting such an ink composition with a substrate, such contact as can be defined by such a pattern; and transferring such an ink pattern to such a substrate. In certain embodiments, such an ink composition is of the sort described herein as suitable for gravure printing, and such a print pattern can be provided by gravure cells. In certain other embodiments, such an ink composition can be of the sort described herein as suitable for screen printing, and such a pattern can be provided by a stencil.

In certain embodiments, such a stencil can be of the sort discussed above or described elsewhere herein. Regardless, a spacer component can be positioned between such a substrate and such a stencil. Without limitation, such a spacer component can adhere to such a substrate and such a stencil, to secure stencil position thereon. In certain embodiments, such a spacer component can comprise a poly(dimethylsiloxane), although those skilled in the art would understand that various other materials can be utilized, with choice of material limited only by suitable adhesion of such a spacer component to a stencil and substrate during printing. Regardless, such a spacer component can have a thickness dimension from about 1.5 mm to about 2.5 mm. As illustrated below, an ink composition can be printed in good quality on a flexible substrate.

The present invention can, in part, also be directed to a composite comprising such a graphene ink composition coupled to a flexible or foldable substrate component, such a graphene composition as can be gravure or screen printed on such a substrate. Such a composition can be considered as comprising an annealation/decomposition product of ethyl cellulose-stabilized graphene. Such a substrate component can comprise a polymeric material of the sort known to those skilled in the art as suitable for flexible/foldable printed electronic devices and applications, such a substrate as can, without limitation, comprise a polyimide material and as can be fabricated with various semiconductor, dielectric and electrode components thereon. Regardless, with respect to such an ink composition, print morphology, resolution, electrical performance and mechanical properties can be substantially maintained over repeated substrate bending or folding.

DETAILED DESCRIPTION OF THE DRAWINGS

FIGS. 1A-E. Development of the graphene ink for gravure printing. (A) Schematic of the ink, showing a graphene sheet stabilized by ethyl cellulose in terpineol. (B) Photograph of the formulated ink. (C-E) Illustration of the gravure printing method decomposed into three steps: (C) flooding of the gravure cells; (D) doctor blading; (E) printing.

FIGS. 2A-H. Optimization of graphene inks for gravure printing. (A) Shear viscosity for the three different ink formulations. (B) Size of printed dots for each ink using a gravure cell of 50 µm. (C-E) Optical images of the printed dots for each ink. (F-H) Optical images showing line formation as the cell spacing is reduced, corresponding to 50, 25 and 5 µm spacing for a cell size of 50 µm.

FIGS. 3A-F. Optical microscopy images of printed graphene lines using cell sizes of 15, 20, 25, 30, 35 and 50 µm for (A-F), respectively. Lines printed without the specified cell size are shaded gray in each case.

FIGS. 4A-D. Characterization of gravure printed graphene lines. (A) Line width and (B) line thickness for varying cell size. (C) Large-area scanning electron micrograph of printed lines. (D) Line height profiles measured by optical profilometry.

FIGS. 5A-F. Characterization of gravure printed graphene for electronics. (A) Line resistance for the varying cavity size. (B) Thickness contraction during annealing for the graphene-EC composite. (C-D) AFM images of a printed line and the bare Kapton substrate, respectively, which illustrates that the printed lines are considerably thinner than the substrate surface roughness. (E) Printed crossbar array. (F) Photograph of large-area patterns.

Figure 6:
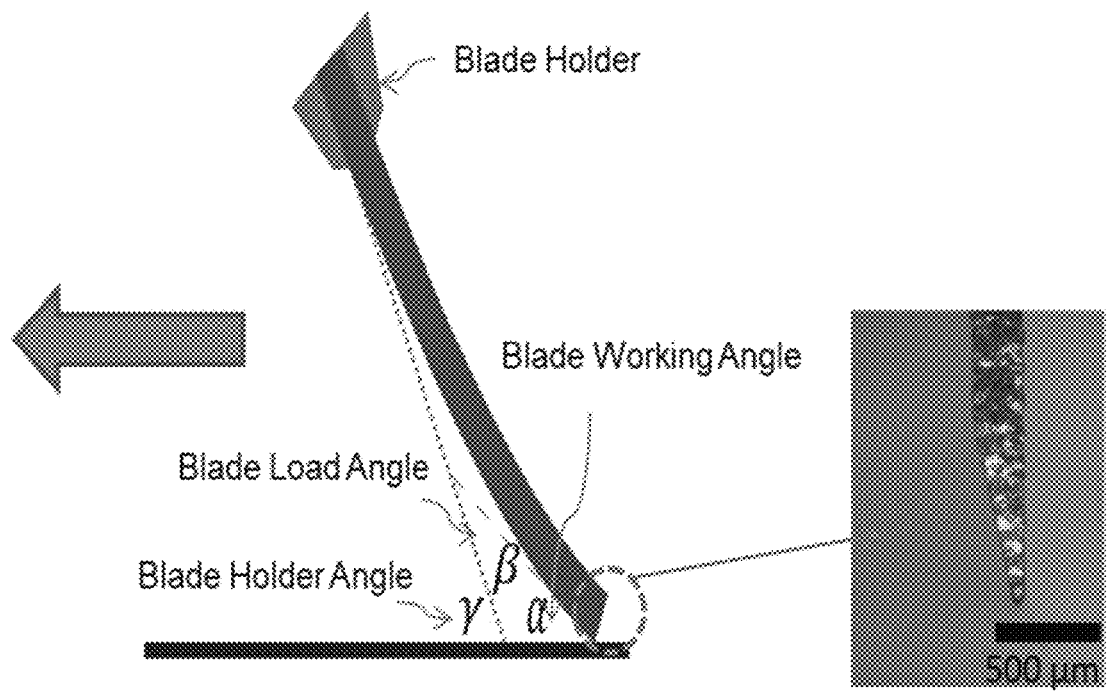

FIG. 6. Diagram defining the doctor blade angle (α) used for the flooding and doctoring processes. As the angle α is increased, the applied pressure decreases.

Figure 7:
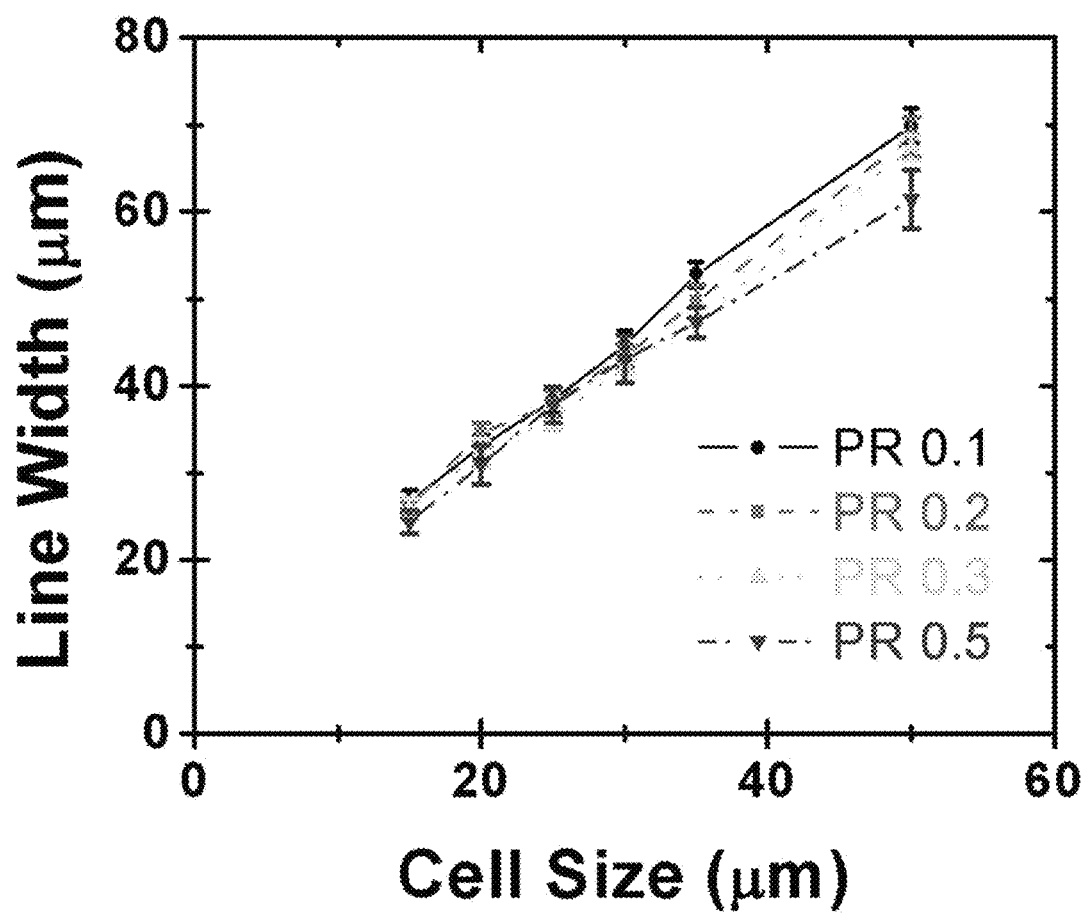

FIG. 7. Line width measurements for lines printed with different cell spacing. The printing ratio (PR) defines the ratio of cell spacing to cell width. The similar width of lines printed at different printing ratios suggests that the additional ink contributes to the line uniformity and thickness rather than increased ink spreading.

Figure 8:
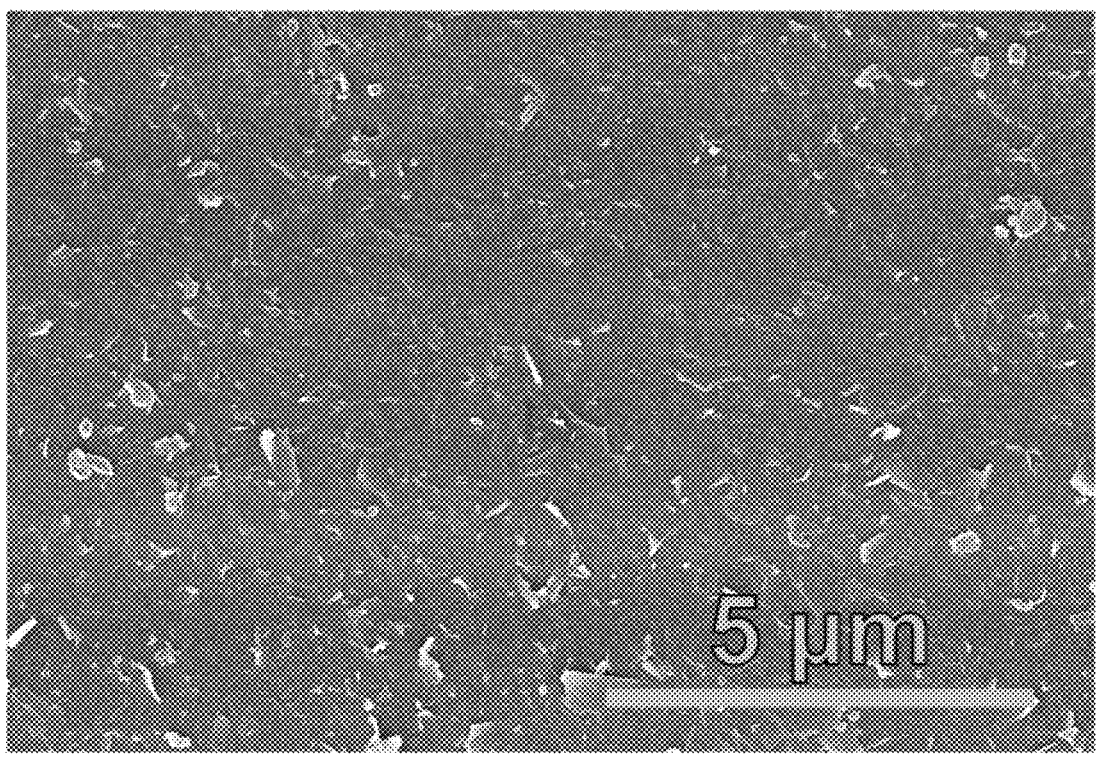

FIG. 8. A scanning electron micrograph of graphene lines indicates a dense and continuous network of flakes.

Figures 9A, 9B, 9C:
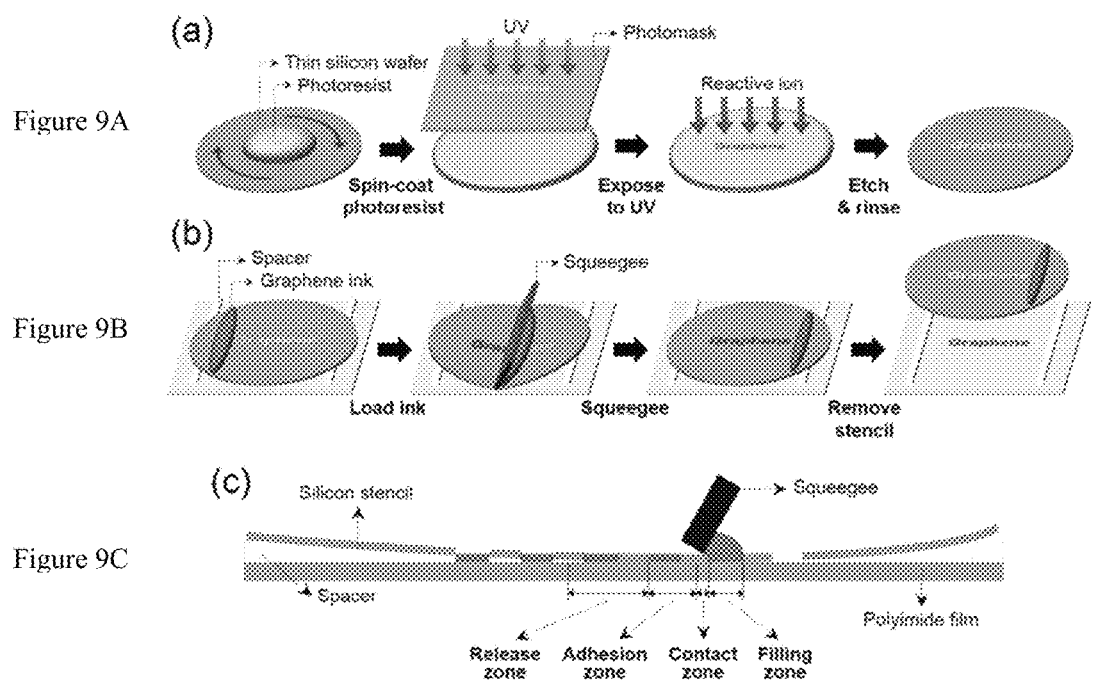

FIGS. 9A-C. (A) Fabrication steps for a thin silicon stencil using conventional lithography techniques. (B) Schematic process of screen printing using the silicon stencil and a pristine graphene ink. (C) Cross-sectional illustration of the screen printing method with the flexible silicon stencil during printing.

FIGS. 10A-D. Schematic diagram of screen printing with a silicon stencil in a cross-sectional view. (A) The graphene ink was placed on the silicon stencil. (B) The squeegee moved the ink and pressed the stencil at the same time, which made a contact between the stencil and the substrate. (C) As the squeegee passed the openings, the ink was printed on the substrate. (D) When the squeegee was removed from the stencil, the stencil was separated from the substrate, leaving the ink on the substrate.

FIGS. 11A-F. (A) Optical microscopy (OM) image of a thin silicon stencil showing line openings with different widths ($w_{screen}$) of 20 (top), 30 (middle), 40 µm (bottom) in a silicon stencil. (B, C) High-resolution OM images for line openings with $w_{screen}$ of 20 and 5 µm, respectively. (D) OM images of graphene lines printed on polyimide films through line openings with $w_{screen}$ of 20 (top), 30 (middle), 40 µm (bottom). The printing was accomplished from two inks of different viscosities (Ink 1 and 2), in two different printing directions (A and B). (E) Measured shear viscosity for Ink 1 and 2. (F) Width ($w_{printed}$) of screen-printed graphene lines measured by optical microscope on polyimide substrates with different inks and printing directions for varying $w_{screen}$.

FIGS. 12A-G. (A) OM images of a screen-printed graphene line with $w_{printed}$ of 40 µm and (B-E) graphene lines with different spacing of 30, 50, 70, and 90 µm on polyimide films. Scale bars are 100 µm. (F) Thickness of screen-printed graphene lines for different inks and printing directions. (G) Comparison of the aspect ratio (thickness/width) and $w_{printed}$ of the printed graphene lines through a 20 µm wide line opening with respect to the ink viscosity and the printing direction.

Figure 13A:
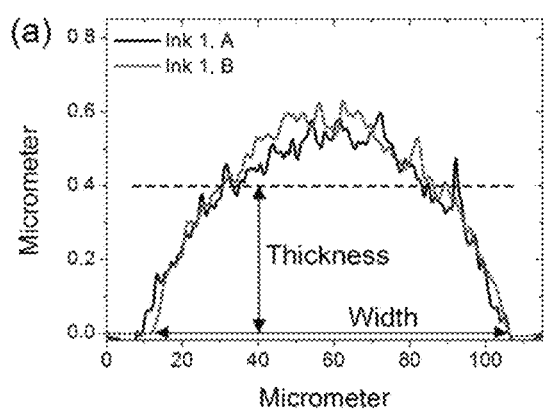
Figure 13B:
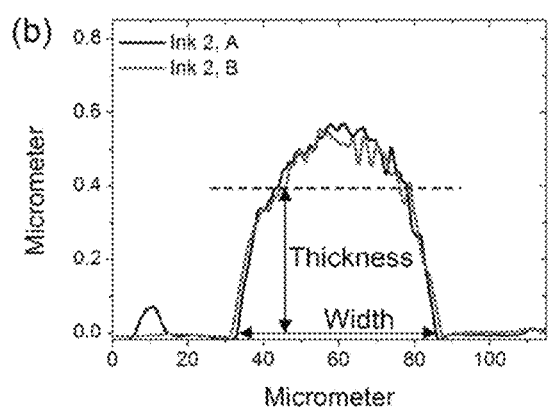

FIGS. 13A-B. Surface profile of screen-printed graphene lines through 20 µm wide line opening, from (A) Ink 1 in Direction A and B and (B) Ink 2 in Direction A and B. $w_{printed}$ was measured from one side to the other side of printed graphene lines and thickness was obtained from average thickness between sides of printed graphene lines.

Figure 14:
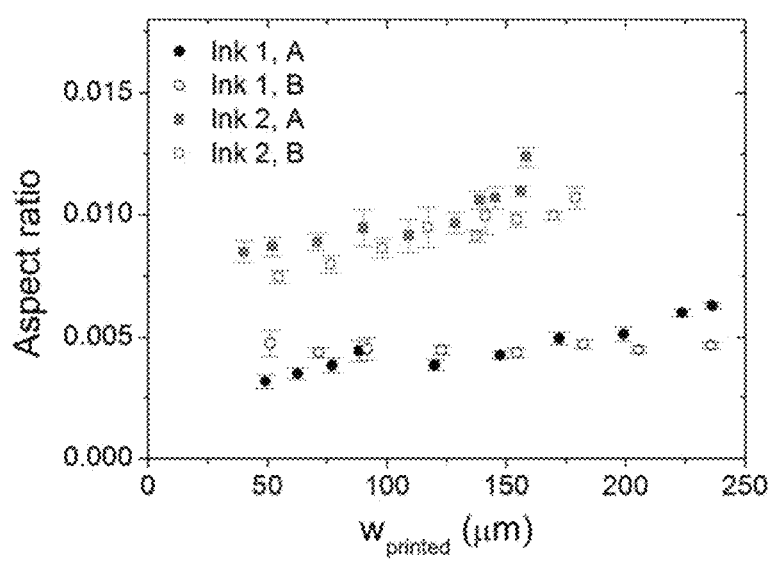

FIG. 14. Aspect ratio (thickness/width) of the screen-printed graphene lines for different inks and printing directions.

FIGS. 15A-D. (A) OM image of screen-printed graphene to measure electrical properties of the graphene lines for different lengths and $w_{printed}$. (B) Scanning electron microscopy image of the graphene after annealing at a temperature of 300° C. for 30 min. (C) Resistance per unit length of the graphene as a function of $w_{printed}$. (D) Relative resistance of the screen-printed graphene lines on flexible substrates with two different thicknesses over 1000 bending cycles at a bending radius of 4 mm, corresponding to 1.0% tensile strain.

Figure 16:
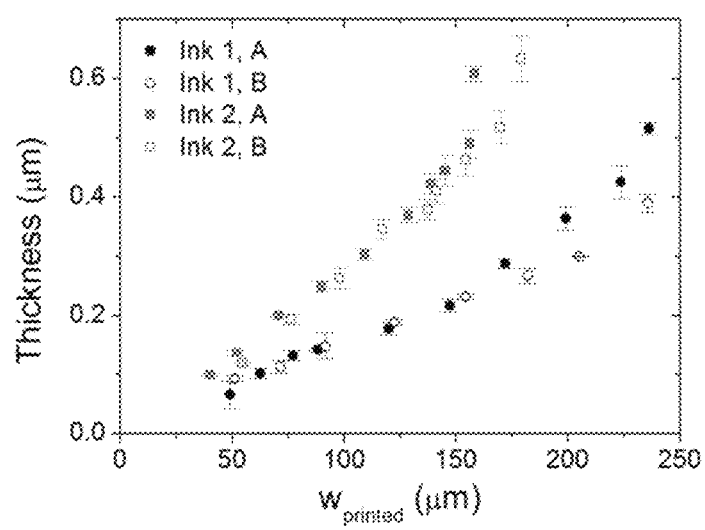

FIG. 16. Thickness of the printed graphene lines after annealing at a temperature of 300° C. for 30 min.

Figure 17:
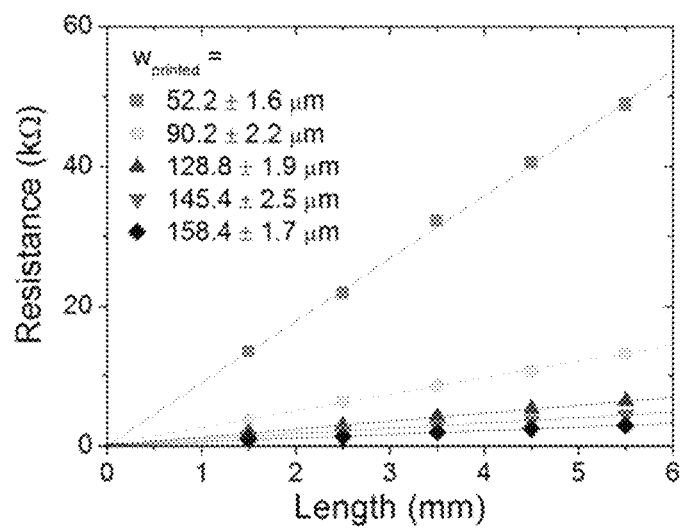

FIG. 17. Measured resistance of the screen-printed graphene lines for different lengths and $w_{printed}$.

FIGS. 18A-E. (A) OM image of screen-printed graphene source and drain electrodes on a polyimide substrate for EGTs (W/L=900 μm/90 μm). (B) Schematic illustration for the EGT architecture fabricated on the graphene electrodes. (C) Transfer and (D) output characteristics of the printed EGTs. The voltage sweep rate was 50 mV s$^{-1}$. (E) Stability of charge carrier mobility (μ) and threshold voltage ($V_{th}$) for the EGTs during repeated bending cycles with a bending radius of 4 mm, corresponding to 1.0% strain.

Figure 19:
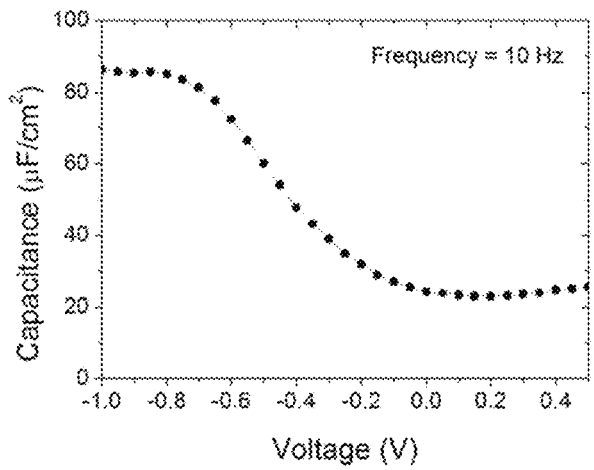

FIG. 19. Capacitance-voltage characteristic for the printed EGTs with screen-printed graphene electrodes, which was measured at a frequency of 10 Hz.

Figure 20A:
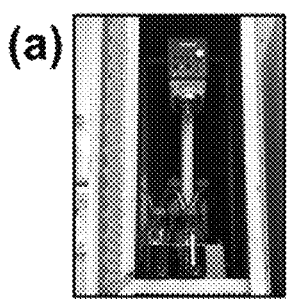
Figure 20B:
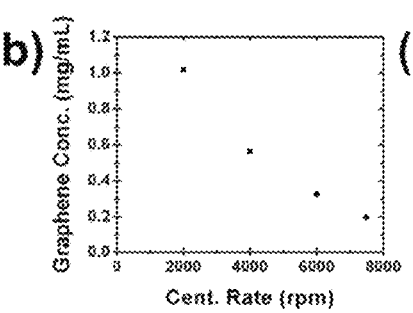
Figure 20C:
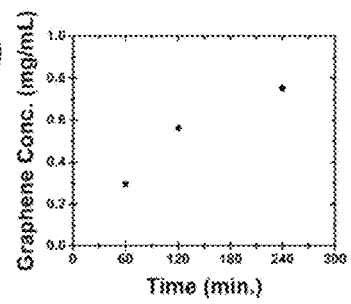

FIGS. 20A-C. Shear mixing of graphene. (A) Laboratory scale high shear mixer with large volumes of graphene dispersion. High graphene concentrations are achieved by shear mixing as a function of (B) centrifugation rate and (C) shear mixing time.

Figure 21A:
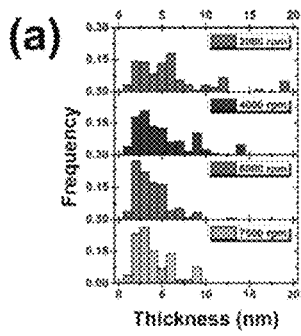
Figure 21B:
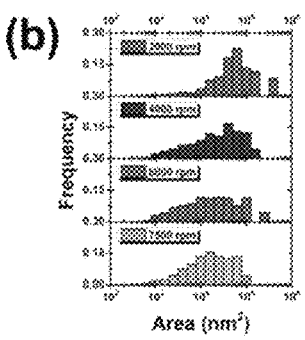
Figure 21C:
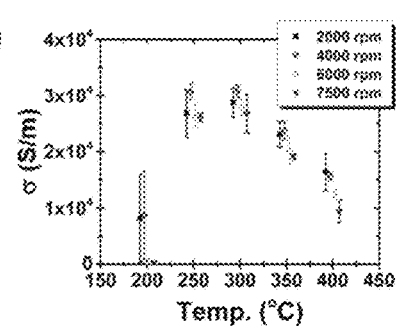

FIGS. 21A-C. Size distribution of graphene particles. Volume-weighted histograms of (A) flake thickness and (B) flake area for graphene following four different centrifugation conditions. (C) Electrical conductivity of graphene films produced from the four different samples, showing a similar, high electrical conductivity for all samples.

FIGS. 22A-C. Controlling the graphene:EC ratio by tuning process parameters. (A) Graphene yield plotted against EC concentration for shear mixing and sonication. (B) Thermal gravimetric analysis of graphene/EC powders, demonstrating the ability to tune the graphene content. (C) Relation of graphene content to the initial EC concentration, both prior to and following the flocculation step.

FIGS. 23A-B. Photonic annealing of graphene patterns. Sheet resistance of graphene patterns on PET with (A) 25% wt. and (B) 50% wt. graphene, processed by thermal and photonic annealing. For the films with a lower EC content, photonic annealing is more effective and results in a sheet resistance comparable to thermal annealing.

DETAILED DESCRIPTION OF CERTAIN EMBODIMENTS

Graphene inks are produced from solvent-exfoliated graphene prepared as described, herein. In particular, graphene is exfoliated from graphite in ethanol and/or dimethylformamide, as a representative $C_2$-$C_5$ alcohol and amide, respectively, with the stabilizing cellulosic polymer EC, which produces a high dispersion yield with minimal processing. After the remaining graphite flakes are removed by centrifugation, a flocculation step is used to remove excess EC from solution, thus isolating graphene-EC as a powder and effectively decoupling the solvents used for exfoliation and printing. This method produces predominantly few-layer graphene flakes, with a typical thickness of ~2 nm and lateral size of approximately 50 nm×50 nm. Small graphene flakes, preferably at sub-micron dimension, are useful for high-resolution printing processes—in particular, for use with gravure printing.

By first producing a graphene-EC powder source, a desired ink solvent and concentration can be widely varied. In this case, the graphene ink is produced by dispersing the graphene-EC powder in a mixture of ethanol and terpineol, which allows rapid and complete dispersion due to the low viscosity of the solvent system. This step is followed by removal of the ethanol to yield polymer-stabilized graphene in terpineol, as shown in FIG. 1A-B. This ink can be directly used, for instance, for gravure printing by employing the flooding-doctoring-printing strategy illustrated in FIG. 1C-E. This method decouples the critical processes of gravure printing, particularly filling the gravure cells with the ink (flooding), removing excess ink from the surface (doctor blading), and transferring the pattern to the substrate (printing). In this manner, the parameters related to these three distinct steps can be independently optimized, enabling a high degree of control over the printing performance.

The three processes of the gravure printing approach used here are strongly influenced by the ink physical properties, especially the viscosity and surface tension. Surface tension is largely determined by choice of solvent (terpineol is shown to be suitable for conductive inks of this invention), leaving viscosity as an ink parameter to tailor. Towards this end, three different inks were produced with varying viscosity in the range of 0.2-3 Pa·s (shear rate: 10 s$^{-1}$), shown in FIG. 2A, corresponding to a solids loading of about 5-about 10% by weight. The significant printing parameters, including the speed and pressure of flooding and doctoring and the speed of printing, were optimized to print dot patterns of each ink, offering a direct comparison as a function of ink viscosity. As shown in FIG. 2B, the size of the printed dots increased for the low viscosity inks due to increased spreading on the substrate; for a 50 μm cell, the dots spread to 68 μm and 80 μm for the high and low viscosity inks, respectively. In addition, the lower viscosity inks tended to produce anisotropic dots with an empty center and an extended tail of ink residue along the direction of doctoring, as shown in FIG. 2C-E. Because the high viscosity ink exhibited superior resolution and pattern fidelity, this ink was used for the remainder of the study outlined below.

While ink deposition from individual cells is at the core of gravure printing, continuous lines (i.e., wires) are particularly important for electronic applications. Continuous linear printed features require well-behaved spreading and merging of ink from neighboring cells, which depends on the spacing between the cells. FIG. 2F-H illustrates this issue for 50 μm cells. As the spacing between cells is decreased from 50 μm to 25 μm, the neighboring drops merge to form a discontinuous, rough-edged line. As the spacing is further reduced to 5 μm, the rough edges are removed, yielding a continuous, uniform line. Importantly, the additional material deposited with decreased cell spacing contributed to the uniformity and thickness of the lines but did not appreciably compromise the resolution. Lines printed using this condition, namely the cell spacing to cell size ratio of 0.1, showed excellent morphology across the range of cell sizes from 15-50 μm, as shown in FIG. 3.

Figures 4A, 4B, 4C, 4D:
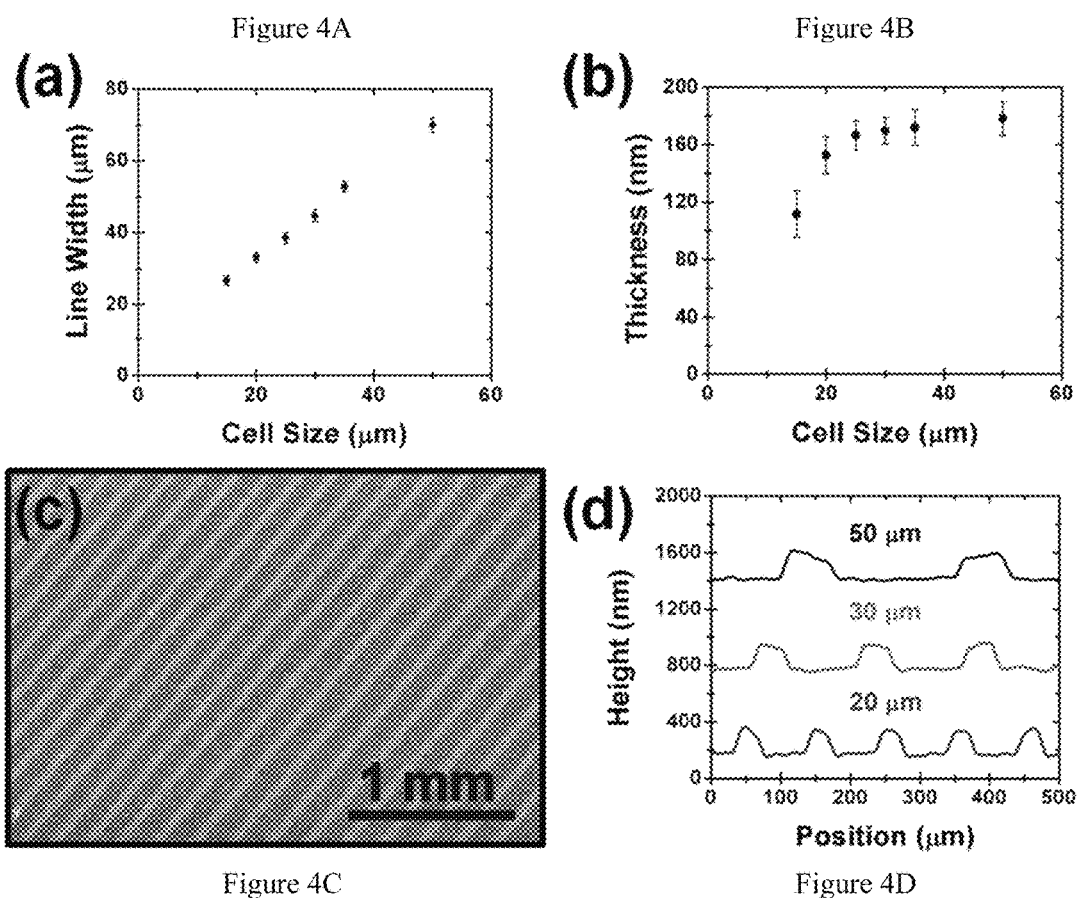

The gravure printed graphene lines were further characterized to assess their suitability for printed electronics. Measurements of the line width indicate the broad tunability in resolution by varying the cell size, as shown in FIG. 4A, with 15 µm cells producing lines that are ~30 µm wide. The line thickness was measured prior to annealing by optical profilometry (FIG. 4B), showing a monotonic increase in thickness that begins to saturate for larger cells, corresponding to the reduced ink spreading relative to the cell size. In addition to well-controlled line dimensions, the optimized printing conditions lead to high quality, uniform printing over large areas, as shown in the scanning electron micrograph in FIG. 4C and height profiles measured by optical profilometry in FIG. 4D.

Figure 5A:
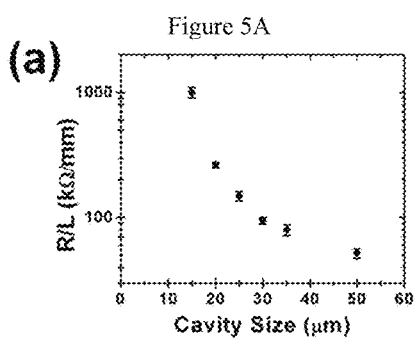
Figure 5B:
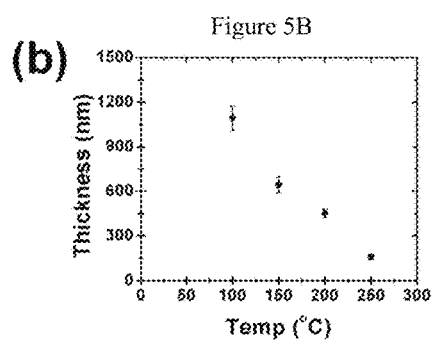
Figure 5C:
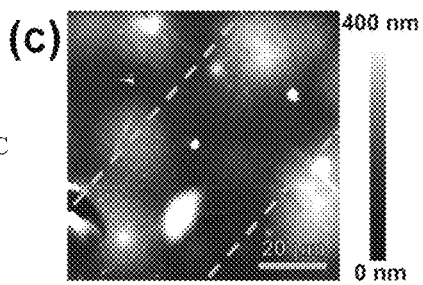
Figure 5D:
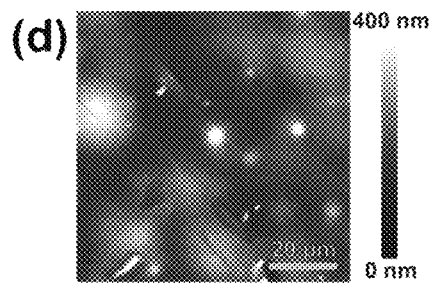

To complement the large-area fidelity of the printing process, the ink chemistry yields a dense and uniform network of graphene flakes following annealing. To establish the electrical properties of the printed graphene lines, conductivity measurements were performed following thermal annealing at 250° C. for 30 minutes. Resistance measurements of the lines are shown in FIG. 5A; for lines printed with cells of 20-50 µm, ten out of ten measured lines were electrically continuous over the entire 8 mm length of the line with a standard deviation in resistance below 10%. This result indicates the continuous nature of the lines, as well as the uniformity in printing from line to line. For lines printed with a 15 µm cell, 8 of the 10 measured lines were electrically conductive, with the same uniformity among those 8 lines as the lines printed with larger cells, which is noteworthy considering the relatively small thickness of the lines compared to the roughness of the Kapton substrate. In particular, while the lines are 100-200 nm thick prior to annealing, a vertical contraction occurs during annealing as the EC polymer stabilizer is partially decomposed. To measure the thickness evolution as a result of annealing, thicker films of the graphene-EC material were inkjet printed onto a silicon wafer. Profilometry measurements of film thickness following different annealing conditions indicate that the graphene-EC composite contracts to ~15% of the original thickness during annealing to 250° C., as shown in FIG. 5B. Atomic force microscopy images, shown in FIG. 5C-D, offer a direct visualization of the resulting nanoscale thickness of the lines. The surface roughness of the substrate, measured to be ~50 nm due primarily to the embedded particles, is large relative to the line thickness of ~15-30 nm. The electrical continuity of such thin lines at a macroscopic length scale, even over a surface with relatively large topographical defects, is a testament to the reliability and quality of the printing process. Overall, the electrical conductivity of the printed graphene lines is estimated to be ~10,000 S/m, based on measurements of line width, resistance, thickness prior to annealing, and film contraction during annealing.

Figure 5E:
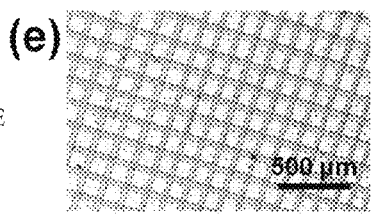
Figure 5F:
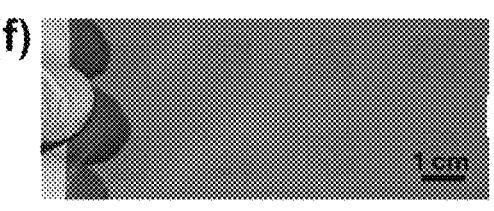

Because the physical processes of gravure printing are defined by filling individual cells, removing excess ink, and transferring the ink to the substrate, the inks and optimized printing parameters developed here can be readily extended to more complex patterns. For example, FIG. 5E shows a crossbar pattern with lines printed in orthogonal directions. This pattern demonstrates the invariance of printed patterns with the printing direction, as the lines are aligned both parallel and orthogonal to the direction of printing. In addition, it demonstrates the robustness of printing even over features ~200 nm thick on the substrate, an important prerequisite to more complex, multi-material structures. FIG. 5F further illustrates large-area patterns printed with graphene, thus verifying the scalability of this technique for rapid, high-volume printing applications.

The present invention demonstrates gravure printing of large-area, high-resolution patterns of pristine graphene on flexible substrates through the formulation of suitable inks and the optimization of printing parameters. In particular, a stable, high-concentration graphene ink with tunable viscosity in a chemically and environmentally benign solvent with established applicability for gravure printing is demonstrated. This strategy employs pristine graphene flakes, with excellent electrical conductivity and compatibility with flexible substrates. By tailoring the ink properties and printing conditions, continuous lines with resolution as fine as ~30 µm are printed over large areas with notable reliability and uniformity. The electrical conductivity of these patterns of ~10,000 S/m is among the highest reported for printed graphene, and is particularly impressive considering the nanoscale thickness of the patterns on a topographically rough substrate. This printing strategy thus offers the opportunity to utilize the two-dimensional nature of graphene in a robust, large-area format. In this manner, the integration of graphene with gravure printing represents a milestone in the development of solution-processed graphene for commercially relevant, highly scalable applications in printed and flexible electronics.

Various other non-limiting embodiments of this invention can be demonstrated through high-resolution patterning of pristine graphene by screen printing using a silicon stencil. The screen printing stencil was prepared from a thin silicon wafer. Silicon is compatible with photolithography processing, which enables well-defined and high resolution stencil patterns. In particular, screen printing of a high concentration, pristine graphene ink is demonstrated, and the effects of ink properties and printing parameters are characterized. High-quality patterns with high conductivity and excellent mechanical tolerance were produced. To demonstrate the feasibility of this approach for printed electronics, all-printed organic thin film transistors on flexible substrates were fabricated using screen-printed graphene source and drain electrodes, and characterized the device performance and mechanical durability were characterized.

Figures 10A, 10B, 10C, 10D:
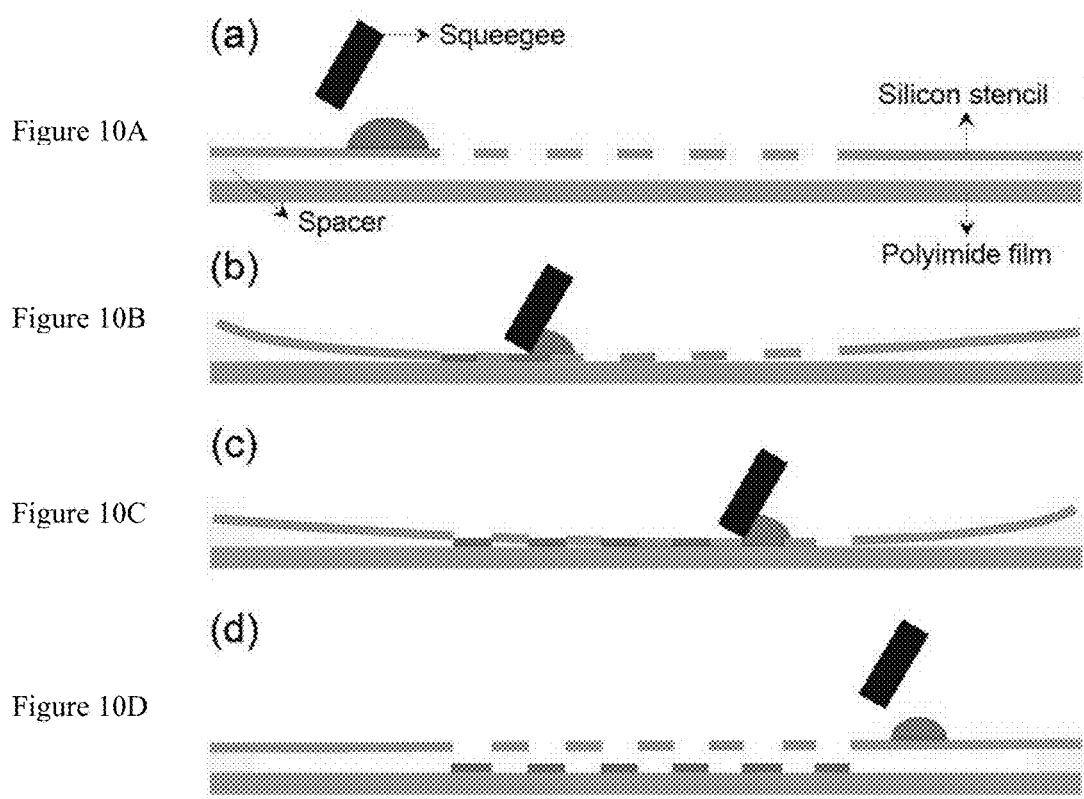
Figures 11A, 11B, 11C, 11D, 11E, 11F:
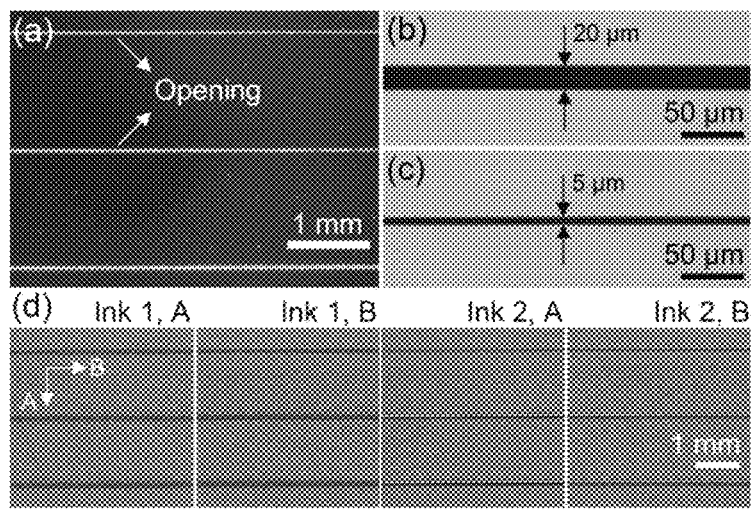

FIG. 9 depicts a schematic diagram for the preparation of the stencil from a silicon wafer and the procedure for screen printing using this stencil. The silicon wafer was first thinned to impart mechanical flexibility. A single-side polished silicon wafer with a thickness of 525 µm was thinned by a simple wet etching process. (G. T. A. Kovacs, N. I. Maluf, K. E. Petersen, *Proc. IEEE* 1998, 86, 1536-1551.) The thinned silicon wafer, with a thickness of about 120 µm or less, was flexible enough to be employed for screen printing. A thinner stencil facilitates easier screen printing for fine lines, because it allows the ink to travel through the stencil and transfer onto the substrate more readily. Silicon wafers with a thickness of 90 (±5) µm were used because the thinned silicon wafers with a thickness less than 85 µm have less than optimal mechanical tolerance to withstand the applied force during printing. As shown in FIG. 9A, the photolithography process was then carried out to pattern openings on the thinned silicon wafers. FIG. 11A shows the optical microscopy (OM) image of the silicon stencil showing line openings with widths ($w_{screen}$) of 20, 30, and 40 µm in the silicon stencil. The line openings were created with high fidelity by reactive ion etching. A high-resolution OM image (FIG. 10B) reveals that the edges of the line openings are straight and the opening shapes are equivalent to the patterns in the photomask. This strategy enabled line openings as narrow as 5 µm in the silicon stencil (FIG. 10C).

FIG. 9B and FIG. 10 display schematic diagrams for screen printing with the silicon stencil. The substrate was held on a vacuum plate, and spacers were inserted between the stencil and the substrate. Due to its low surface roughness, the polished face of the silicon stencil was placed down to make better contact between the stencil and the substrate during printing. The spacer was made with poly(dimethylsiloxane) (PDMS) at a thickness of ~2 mm. Use of different spacer thicknesses from about 1.5 mm to about 2.5 mm did not change the printing quality significantly. The somewhat adhesive surface of the PDMS spacers helps to secure the silicon stencil in position during printing. The graphene ink was then placed on top of the stencil and pushed by a squeegee. FIG. 9C represents a schematic cross-sectional view of the stencil during printing, illustrating the equivalent mechanics of screen printing with a silicon stencil and a conventional screen. During printing, the squeegee forces the ink through the stencil while simultaneously pressing the stencil. Because the thin silicon wafer is flexible, the stencil bends, providing contact between the stencil and the substrate (contact zone). In front of the squeegee edge, the ink is moved and penetrates into the openings of the stencil (filling zone). After the squeegee edge passes the openings, the graphene ink in the openings adheres to the substrate (adhesion zone). Finally, the stencil is lifted up, leaving the ink on the substrate (release zone).

To prepare the graphene ink, solvent-exfoliated graphene was produced by ultrasonication of graphite in a solution of ethyl cellulose (EC) in ethanol. This strategy, previously reported, offers high graphene yields (~0.2 mg/mL) with a short processing time, limiting the degradation of the intrinsic structure and properties. To isolate large graphene flakes with minimal polymer binder, a two-step centrifugation-based classification method was used. The first step at a lower centrifugation rate removed thick, unexfoliated graphite particles, retaining the supernatant. The second step at a higher rate isolated graphene flakes and EC as the sediment. This sample of graphene was redispersed with additional EC in ethanol and isolated as a solid by a previously-reported flocculation procedure. The flakes produced by this method are primarily few-layer graphene with a typical thickness of ~2 nm and a typical area of approximately 70 nm×70 nm, as determined by atomic force microscopy (not shown). By isolating the graphene/EC composite as a powder, broad control over the final ink composition is enabled. Inks were prepared from the graphene/EC powder in terpineol, a well-established solvent for screen printing with EC as a binder. The graphene/EC powder was dispersed in ethanol and terpineol by bath sonication, and the ethanol was removed under heating. The ethanol is used to facilitate dispersion because it maintains a low dispersion viscosity, facilitating more effective sonication, and is readily removed by applying heat.

To investigate the screen printing process, printing was performed in two different directions (FIG. 11D), perpendicular (Direction A) and parallel (Direction B) to the line openings. In addition, graphene inks with two different viscosities were used. A different grade of EC is used in each ink to vary the viscosity by a factor of ~10 while maintaining the same solids loading. The viscosity of each ink is shown in FIG. 11E, with a shear viscosity of ~1 and ~10 Pa·s for Ink 1 and Ink 2, respectively, at a shear rate of 10 s$^{-1}$. FIG. 10D presents the screen-printed graphene lines on polyimide films using line openings with $w_{screen}$ of 20 (top), 30 (middle), and 40 (bottom) μm. The OM images show precisely printed graphene lines, indicating the high-quality printing of graphene achieved using the silicon stencil. To determine the printing characteristics with regard to the ink viscosity and printing direction, screen printing was executed with line openings for varying $w_{screen}$ from 5 μm to 50 μm. For Ink 1, the minimum screen widths to offer high quality printing were 7.5 and 10 μm for printing perpendicular and parallel to the lines, respectively. For Ink 2, they were 15 and 20 μm for printing perpendicular and parallel, respectively. This indicates that printing perpendicular to the line openings and using a lower viscosity are better for screen printing with fine line openings. It has been reported that the squeegee can deform more into the line openings perpendicular to the screen printing direction, compared to those parallel to the printing direction, which causes higher pressure to the ink underneath the squeegee in perpendicular openings than parallel openings. This higher pressure forces the ink to contact the substrate better, leading to a higher quality print. In addition, the better printing capability with the lower viscosity ink can be attributed to the easier penetration into the stencil because it generates lower resistance to flow when the ink travels through the fine line openings.

Figure 12A:
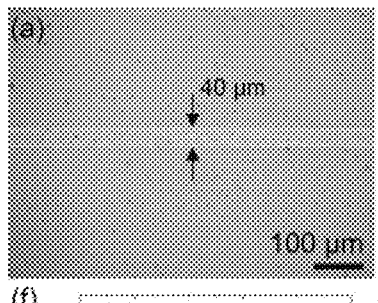
Figure 12A:
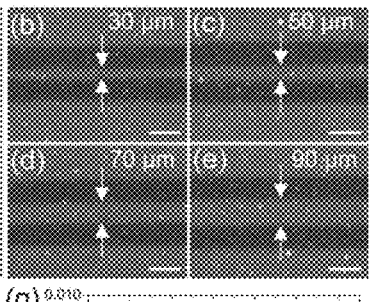
Figure 12F:
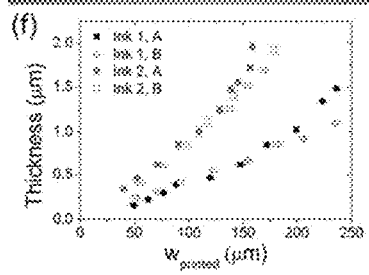
Figure 12G:
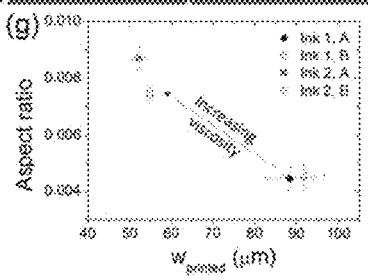

The width of printed graphene lines ($w_{printed}$) was measured for lines printed from varying $w_{screen}$, as shown in FIG. 11F. It was observed that the printing direction did not affect $w_{printed}$ significantly, whereas $w_{printed}$ of Ink 1 was much larger than that of Ink 2 for the same $w_{screen}$. Larger $w_{printed}$ with Ink 1 than that of Ink 2 can be explained by more spreading on the substrate due to the lower viscosity. As a result, even though the printing capability (≥15 μm) with Ink 2 was worse than that (≥7.5 μm) with Ink 1, printed graphene lines (FIG. 12A) as narrow as 40 μm were achieved with Ink 2, while the narrowest lines achieved with Ink 1 were 50 μm. Additionally, printed graphene lines were attained with different spacings of 30, 50, 70, and 90 μm, as shown in FIGS. 12B, C, D, and E, respectively, which show uniform spacing between the lines. FIG. 12F shows the measured thickness of the screen-printed graphene lines as a function of $w_{printed}$, obtained from surface profile measurements (FIG. 13). Thicknesses for a given ink were similar for the different printing directions. On the other hand, graphene lines from Ink 2 were thicker than those printed from Ink 1 for the same $w_{printed}$, which implies that the higher viscosity of Ink 2 produced higher aspect ratio features (thickness/$w_{printed}$) compared to Ink 1, as shown in FIG. 14. FIG. 12G reveals this issue for printed graphene lines through the line opening with $w_{screen}$ of 20 μm. In terms of better printing resolution and higher aspect ratio, Ink 2 is favorable for screen printing. As a result, further experiments were executed with Ink 2.

In order to characterize the electrical properties of the graphene lines, the graphene was screen-printed with a test pattern for various values of $w_{printed}$, as shown in FIG. 15A. The pattern contains six contact pads for the measurement of electrical resistance at different total line lengths. Prior to measurement, they were annealed in a furnace at a temperature of 300° C. for 30 min, which led to partial decomposition of the EC polymer stabilizer to produce a dense and continuous network of graphene flakes (FIG. 15B) for higher conductivity. Decomposition of the EC resulted in a decrease of the pattern thickness by ~70%, as shown in FIG. 16. Surface roughness of the annealed graphene was measured to be 32 nm by atomic force microscopy (AFM). As shown in FIG. 15C, the resistance per unit length was calculated from the linear relationship between the measured resistance and the line length (FIG. 9), which displays a decrease of the resistance as $w_{printed}$ increases. This result is well-matched with the definition of electrical resistance:

$$R = \rho \frac{L}{A} \tag{1}$$

where ρ, L, and A are the resistivity, the length, and the cross-sectional area of the conductive line, respectively. Based on the measured resistance and the line geometries, the conductivity was calculated to be $1.86 \times 10^4 \pm 0.19 \times 10^4$ S/m, highly competitive among solution-processed graphenes. Previous studies have demonstrated resilient mechanical properties of printed graphene lines. To verify the mechanical bending tolerance of the screen-printed graphene on flexible substrates, bending tests were carried out for the graphene lines with different thicknesses of 137 and 637 nm, which were printed through the line openings with $w_{screen}$ of 20 and 100 μm. The bending test was performed at a bending radius of 4 mm, corresponding to 1.0% tensile strain. FIG. 15D shows the relative resistances of the graphene lines over the course of the bending test, revealing a negligible change during 1000 bending cycles and thus verifying the excellent bending stability of screen-printed graphene, independent of the line thickness.

Figure 18A:
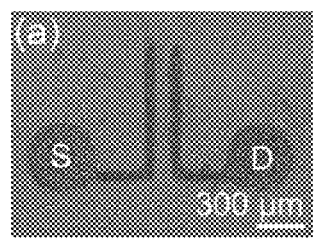
Figure 18B:
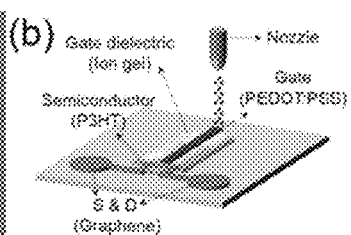
Figure 18C:
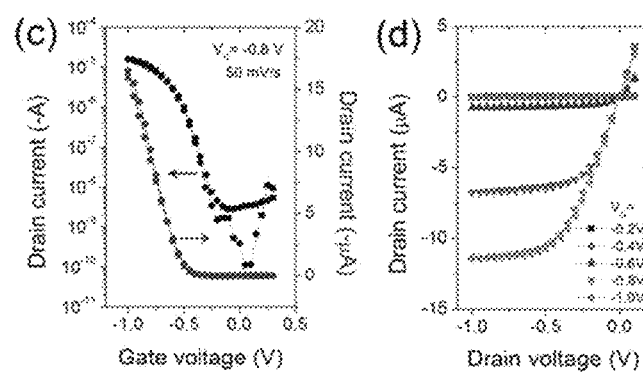

Electrolyte gated transistors (EGTs), which employ an electrolyte as a gate insulator, are promising for flexible printed electronics, due to the high capacitance of the electrolyte, enabling low voltage operation, as well as broad process compatibility with printing on flexible substrates. To examine screen-printed graphene for a potential electronic application, EGTs were fabricated using screen-printed graphene for source and drain electrodes on a polyimide substrate, as shown in FIG. 18A. The channel length (L) and the width (W) were 90 and 900 μm, respectively. FIG. 18B shows the schematic device structure of the EGTs, in which poly(3-hexylthiophene) (P3HT), ion-gel, and poly(3,4-ethylenedioxythiophene):poly(styrene sulfonate) (PEDOT:PSS) were printed by aerosol-jet printing, for the semiconductor, gate dielectric, and gate electrode, respectively. FIGS. 18C and 18D present the measured transfer and output characteristics of the fabricated EGTs. The devices exhibit negligible current hysteresis between forward and backward scans in the transfer curve, and good linear and saturation behavior at low and high drain voltage in the output curve. The charge carrier mobility (μ) and the threshold voltage ($V_{th}$) were calculated to be $0.21 \pm 0.02$ cm$^2$ V$^{-1}$ s$^{-1}$ and $0.42 \pm 0.02$ V, respectively, from the plots of the square-root drain current ($I_D^{1/2}$) as a function of the gate voltage ($V_G$), according to the standard saturation regime relation:

$$I_D = \mu C i \frac{W}{2L}(V_G - V_{th})^2 \quad (2)$$

Figure 18E:
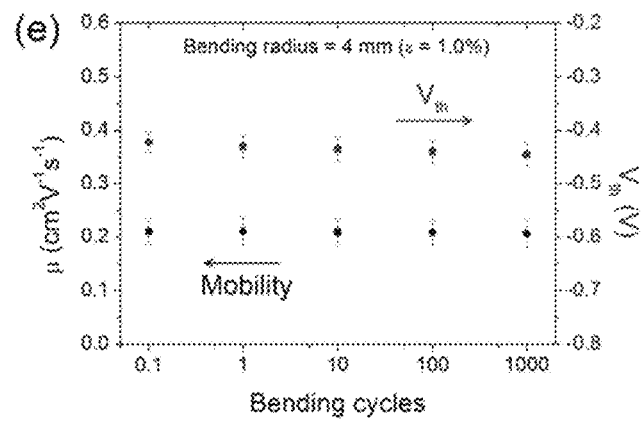

The capacitance ($C_i$) of the ion-gel gate insulator was estimated to be 86 μF/cm$^2$ by the capacitance-voltage characteristics (FIG. 19). The devices had ON/OFF current ratios of ~10$^4$. To investigate the mechanical flexibility of the printed EGTs with the graphene source and drain electrodes, we observed the device performance of the EGTs during continuous bending cycles, to a bending radius of 4 mm (a tensile strain of 1.0%). FIG. 18E shows minimal change in device performances in terms of μ and $V_{th}$ after continuous bending cycles. After 1000 bending cycles, μ and $V_{th}$ only decreased by 1.9% and increased by 0.02 V, respectively. These results suggest that the highly flexible graphene source and drain electrodes were helpful to minimize the degradation of the device performance.

As demonstrated, the present invention provides fine patterning of pristine graphene by screen printing using a silicon stencil and a high conductivity ink based on graphene and ethyl cellulose in terpineol. A well-defined stencil was obtained from a thin silicon wafer by a photolithography process, which was produced with openings as fine as 5 μm on ~90 μm-thick silicon wafers. The silicon stencil facilitated screen printing for high-quality graphene patterns, achieving high-resolution lines as narrow as 40 μm without additional surface treatment of the stencil or substrate. The screen-printed graphene lines on polyimide films exhibited a high electrical conductivity of ~$1.86 \times 10^4$ S/m and outstanding mechanical flexibility, suitable for electronic applications. With the high-quality and flexible graphene patterns as source and drain electrodes, all-printed EGTs on flexible substrates showed desirable transfer and output characteristics, as well as durable operation over many bending cycles. Overall, this invention establishes a scalable method for the facile and practical printing of highly conductive graphene patterns for flexible and printed electronics.

EXAMPLES OF THE INVENTION

The following non-limiting examples and data illustrate various aspects and features relating to the methods and compositions of the present invention, including graphene ink compositions, as are available through the methodologies described herein. In comparison with the prior art, the present compositions, preparatory methods and printing methods provide results and data which are surprising, unexpected and contrary thereto. While the utility of this invention is illustrated through the use of several ink compositions, it will be understood by those skilled in the art that comparable results are obtainable through graphene ink compositions comprising a range of solvents, solids and graphene concentrations, together with associated methods for preparation and printing, as are commensurate with the scope of this invention. (Examples 1-9 can be considered in the context of gravure printing and ink compositions useful herewith, while examples 10-16 can be considered in the context of screen printing and related ink compositions.)

Example 1

Graphene Exfoliation and Processing: Natural graphite flake (10.0 g, Asbury Graphite Mills, 3061 Grade) was dispersed in a solution of ethyl cellulose (EC) in ethanol (2% w/v dispersion, 200 mL; EC: Aldrich, viscosity 4 cP, 5% in toluene/ethanol 80:20, 48% ethoxy; ethanol: Koptec, 200 proof) in a stainless steel beaker. The dispersion was sonicated using a probe sonication system (Fisher Scientific Sonic Dismembrator Model 500, 13 mm Branson tip) for 90 minutes at 50 W in an ice water bath. The resulting dispersion was centrifuged (Beckman Coulter Avanti® J-26 XPI) at 7,500 rpm (~10,000 g) for 15 minutes, and the supernatant was collected. This dispersion was mixed with deionized water (4:3 weight ratio) and centrifuged at 7,500 rpm for 10 minutes, after which the supernatant was discarded. The resulting graphene-EC solid was dried and redispersed in ethanol at a concentration of 10 mg/mL. This dispersion was mixed with an aqueous solution of NaCl (0.04 g/mL, Sigma-Aldrich, >99.5%) in a 16:9 weight ratio and centrifuged at 7,500 rpm for 8 minutes, after which the supernatant was removed. To remove any residual salt, the resulting graphene-EC solid was washed with deionized water and isolated by vacuum filtration (Millipore Nitrocellulose HAWP 0.45 μm filter paper). This isolated graphene-EC product was then dried, yielding a fine black powder. This process was repeated to accrue sufficient material for ink production.

Example 2

Ink Preparation and Characterization: Graphene-EC powder (1.0 g) was dispersed in ethanol (~25 mL) and terpineol (10 mL, Aldrich, mixture of isomers, anhydrous) by bath sonication. This dispersion was passed through a 3.1 μm glass fiber filter membrane (Acrodisc®). The filtered dispersion was heated on a hot plate to remove ethanol, yielding a final ink of 10% w/v solids in terpineol (Ink 1, FIG. 2A). The medium and low viscosity inks (Inks 2 and 3, FIG. 2A, respectively) were prepared by a similar technique with different concentrations (7.2% w/v and 5% w/v solids, respectively). The shear viscosity of the inks was measured using a Physica MCR 300 rheometer equipped with a 25 mm, 2° cone and plate geometry at shear rates of $1-1000 \text{ s}^{-1}$. The temperature was controlled by a Peltier plate at 25° C.

Example 3

Gravure Printing Pattern Fabrication: A Si(100) wafer was cleaned by piranha solution (5:1 $H_2SO_4$ and $H_2O_2$) for 15 minutes at 120° C., rinsed with deionized water and dried. The wafer was prebaked at 115° C. for 1 minute, after which photoresist (Shipley 1813) was spin-coated onto the wafer at 3000 rpm for 30 seconds. A soft baking step was carried out at 110° C. for 1 minute to drive off solvents and improve adhesion. A mask designed with the gravure cell patterns was aligned with the wafer during a 5 second exposure to UV light (MABA6). The wafer was immersed in developer solution for 1 minute, rinsed with deionized water, and dried. The patterned wafer was then dry etched to the required depth by reactive ion etching (SLR 770 Deep Trench Etcher). The wafer was then washed in acetone, ethanol, and deionized water prior to being used as a gravure pattern.

Example 4

Gravure Printing of Graphene: The graphene inks were printed onto 125 μm thick DuPont Kapton® FPC films purchased from American Durafilm using a direct gravure printing system. The gravure pattern consisted of square cells from 2 to 50 μm in width and 5 μm in depth. For printing lines, the spacing between cells was varied from 0.1 to 1×cell width. During the flooding step, the graphene ink (0.1 g) was flooded onto the gravure plate using the doctor blade at 70° and a typical speed of 5 cm/s. Doctor blading was then performed at 55°, also at a typical speed of 5 cm/s. Finally, the ink in the cells was transferred to the substrate through a nip consisting of a soft and a hard roll at a speed equivalent to the doctoring speed. To print the crossbar pattern (FIG. 5E), the first printed layer was dried in air for 5 minutes prior to printing of the second layer. The substrate orientation relative to the printing direction was maintained, while the gravure pattern was rotated, such that the process more closely resembles a continuous web process.

Example 5

Characterization of Printed Patterns: The width of the printed lines was measured from optical micrographs obtained on an Olympus optical microscope. The line thickness was measured using a Bruker Contour GT 3D Optical Microscope. For line thickness measurements and height profiles, the height data were averaged over 0.3 to 2 mm of line length to average out the substrate roughness. Statistics for line thickness were based on ~25 measurements for each data point, and statistics for line width were based on 10 measurements for each data point. For electrical measurements and AFM/SEM images, the patterns were annealed at 250° C. for 30 minutes in a tube furnace, with a stepped temperature ramp to avoid temperature overshoot. For SEM images, a 5 nm film of Au was sputtered onto the samples to mitigate charging effects. SEM images were obtained on a Hitachi SU8030 Field Emission SEM. AFM images were obtained using a Bruker ICON PT AFM System in tapping mode with a Veeco Model RTESP (MPP-11100-10) cantilever. Line resistance was measured using a two-probe measurement technique with Au probes, such that the contact resistance was negligible. Measurements of the evolution of film thickness with annealing were performed on inkjet-printed films on $Si/SiO_2$ using a Dektak 150 Stylus Surface Profiler.

Example 6

Printing Parameter Optimization: Gravure printing is typically characterized by a tradeoff related to the ink viscosity, with less viscous inks filling cells better but transferring less ink during the pressing stage. The higher volume transfer associated with a high viscosity ink is preferable for improving pattern fidelity and conductivity, but the decreased flow of the ink during doctor blading tends to cause unreliable ink filling. To overcome this tradeoff, an ink flooding step is introduced prior to the doctoring process to enhance filling of the gravure cells. The critical parameters to tune for each of the three steps, described in FIG. 1C-E, are the speed and pressure. The flooding process is done with the doctor blade working angle (α) at 70° (see FIG. 6), with a speed of 2.5-30 cm/s. The quality of gravure printing was not significantly affected by the speed of the flooding step within this range. To independently control printing parameters, the speed of the flooding step is decoupled from the subsequent doctoring and printing steps. The doctoring process is performed with the doctor blade working angle at 55° and speeds of 2.5-30 cm/s. As the doctoring speed increased, the ink residue decreased, but the decrease in residue at higher speeds was limited by an increase in the lubrication film above a speed of 10 cm/s. At a higher doctoring angle (lower pressure), more ink residue is evident, while a lower doctoring angle (higher pressure) removed more ink from the cells. The printing process was performed at the doctoring speed to maximize throughput and limit ink residue, and the ink transfer increased as the speed decreased. The highest fidelity transfer was observed for a doctoring/printing speed of 2.5-5 cm/s.

Example 7

Line Width for Different Cell Size and Spacing: The resolution and quality of a printed line depends on both the size of the gravure cells used and the spacing between them, as illustrated in FIG. 2F-H, FIG. 3, and FIG. 4A. As the spacing between cells is reduced to remove rough line edges, the additional material does not lead to a substantial decrease in the resolution. This effect is shown in FIG. 7, which plots the line width against gravure cell size at 4 different printing ratios. The near overlap of the different printing ratios confirms that the added material contributes to smoothing of the line edges and increasing of the line thickness, but does not increase the line width appreciably.

Example 8

Scanning Electron Microscopy of Graphene Lines: Scanning electron microscopy of the graphene lines following annealing reveals the resulting dense and continuous network of graphene flakes, as shown in FIG. 8.

Example 9

Conductivity Estimate of Gravure Printed Lines: An estimate of the line conductivity was obtained using line resistance measurements, line width, line thickness prior to annealing, and the contraction in thickness as a result of annealing. The data are as follows, for lines printed with 50 μm cells:

$R/L$=51.9±4.4 kΩ/mm;

$W$=69.9±2.0 μm;

$T$=(178±11.8 nm)*(0.144±0.019)=25.6±3.7 nm

σ=10800±1800 S/m

Example 10

Graphene Exfoliation, Processing and Characterization: Natural graphite flake (20.0 g, Asbury Graphite Mills, 3061 Grade) was dispersed in a solution of ethyl cellulose (EC) in ethanol (0.1% w/v dispersion, 200 mL; EC: Aldrich, viscosity 4 cP, 5% in toluene/ethanol 80:20, 48% ethoxy; ethanol: Koptec, 200 proof) in a stainless steel beaker. A probe sonication system (Fisher Scientific Sonic Dismembrator Model 500, 13 mm Branson tip) was used to sonicate the dispersion for 105 min at 50 W in an ice water bath to exfoliate graphene sheets. The resulting dispersion was centrifuged (Beckman Coulter Avanti® J-26 XPI) at 5000 rpm (~4,500 g) for 15 min, and the supernatant was collected. This dispersion was further centrifuged at 7500 rpm (~10000 g) for 15 min, and the sediment was collected. The wet sediment was redispersed with ethanol (25 mL ethanol per 1.0 g sediment) and EC (100 mg EC per 2.0 g sediment; EC: Aldrich, viscosity 22 cP, 5% in toluene/ethanol 80:20, 48% ethoxy) by bath sonication for 3 h. This dispersion was passed through a 3.1 Lm glass fiber filter membrane (Acrodisc®). It was then mixed with an aqueous solution of NaCl (0.04 g/mL, Sigma-Aldrich, >99.5%) in a 16:9 weight ratio and centrifuged at 7500 rpm for 8 min, after which the supernatant was removed. To remove residual salt, the resulting graphene-EC solid was suspended in water, bath sonicated for 20 min, and collected by centrifugation at 7500 rpm for 10 min. This isolated graphene-EC composite was then dried to yield a powder. This process was repeated to produce enough material for ink production. Thermo gravimetric analysis of this powder revealed 78.3% mass retention at 400° C., estimated to reflect the graphene solids content (temperature ramp at 10° C./min in air). AFM characterization was performed on samples dropcast on Si/SiO$_2$ wafers. Si/SiO$_2$ wafers were cleaned by sonication in acetone and isopropanol. They were then immersed in a solution of 2.5 mM 3-aminopropyl triethoxysilane (Aldrich, 99%) in isopropanol for 30 min. A diluted dispersion of graphene/EC in ethanol was dropcast onto the wafers and left for 10 min. After blowing the wafers dry with N$_2$ and rinsing with isopropanol, they were annealed in air at 400° C. in a tube furnace for 30 min to remove the EC. AFM images were obtained using an Asylum Research Cypher AFM in non-contact tapping mode, with a Nanoworld NCHR probe.

Example 11

Ink Preparation and Characterization: Graphene-EC powder (0.5 g) and EC (0.5 g, Aldrich, 4 cP at 5 wt. % in toluene/ethanol 80:20) was dispersed in ethanol (~25 mL) and terpineol (5.0 mL, Aldrich, mixture of isomers, anhydrous) by bath sonication for ~90 min. The dispersion was passed through a 3.1 μm glass fiber filter membrane (Acrodisc®). The filtered dispersion was heated on a hot plate to remove ethanol, yielding a final ink of 20% w/v solids in terpineol, with a graphene:EC ratio of 2:3 by weight (Ink 1). The higher viscosity ink (Ink 2) was prepared similarly using a higher viscosity EC sample (Aldrich, 22 cP at 5 wt. % in toluene/ethanol 80:20). In this way, the two inks are characterized by nominally equivalent graphene concentration and total solids loading but exhibit viscosity varying by about one order of magnitude. The shear viscosity of the inks was measured using a Physica MCR 300 rheometer equipped with a 25 mm, 2° cone and plate geometry at shear rates of 0.1-1000 s$^{-1}$ The temperature was controlled by a Peltier plate at 25° C.

Example 12

Fabrication of Silicon Stencil and PDMS Spacer: A 5-inch silicon wafer with a thickness of 525 (±25) m was submerged in a potassium hydroxide (KOH) bath (30 wt. % KOH in deionized water) at 90° C. for 105 min, rinsed with deionized water, and dried. The wafer was prebaked at 200° C. for 5 min, vapor-coated with hexamethyldisilazane for 3 min, and spin-coated with photoresist (AZ9260) at 300 rpm for 10 sec and at 2500 rpm for 60 sec, sequentially. After soft-baking at 110° C. for 165 sec, the photoresist was exposed to UV light through the photomask with patterns for line openings by using a mask aligner (MA6, Karl Suss). The wafer was immersed in a developer solution AZ400K and deionized water (1:4 v/v) for 3 min, and rinsed with deionized water and dried. The wafer was then etched by reactive ion etching (SLR-770, Plasma-Therm) for 50 min, and the photoresist was rinsed with acetone, ethanol, isopropanol, and deionized water. The PDMS spacer was made by mixing PDMS pre-polymer with its curing agent (10:1 w/w, Sylgard 184, Dow Corning) and curing it in an oven at 70° C. for 2 h.

Example 13

Characterization of Printed Graphene: The printed graphene was characterized using optical microscopes (KH-7700, HIROX), a scanning electron microscope (JSL-6500, JEOL), and an atomic force microscope (Multimode 8, Bruker). Surface profiles were collected using a surface profiler (P-7, KLA-Tencor). The electrical properties were measured using a two-probe measurement technique with a source measurement unit (236, Keithley). All the data points for characterization were made based on 5 measurements.

Example 14

Fabrication and characterization of electrolyte-gated transistors: Source and drain electrodes were made by screen printing with graphene ink on a 75 μm-thick polyimide film (Kapton, Dupont), followed by annealing in a furnace at a temperature of 300° C. for 30 min. The channel length and width were 90 and 900 μm, respectively. A semiconductor, a dielectric, and a gate electrode were deposited sequentially onto graphene electrodes by aerosol-jet printing (AJ 200, Optomec) in air with the substrate temperature maintained at 60° C. to enhance ink drying. The semiconductor was printed with an ink containing P3HT dissolved in chloroform (1 mg/ml) and terpineol (9:1 by weight) for a thickness of 50 nm. For the dielectric, ion-gel was printed with an ink containing a triblock copolymer of poly(styrene-b-methyl methacrylate-b-styrene) (PS-PMMA-PS), ionic liquid of 1-ethyl-3-methylimidazolium bis(trifluoromethylsulfonyl) imide ([EMIM][TFSI], EMD Chemicals), and ethyl acetate at a mixing ratio of 1:9:90 (w/w/w). The gate electrode was printed with an ink containing PEDOT: PSS (PH1000, Heraus) and ethyl acetate (9:1 by weight). The flow rates of carrier gas and sheath gas were 10 and 45 sccm for P3HT, 16 and 70 sccm for the ion-gel, and 20 and 80 sccm for PEDOT:PSS, respectively, with a 150 µm-diameter nozzle. Finally, the sample was annealed on a hot plate with a temperature of 120° C. for 30 min in a glovebox filled with nitrogen gas. The devices were measured using source meters (236 and 237, Keithley) and an electrometer (6517A, Keithley) in nitrogen atmosphere at room temperature. The gate capacitance was measured by an impedance analyzer (4192A, Hewlett-Packard).

Example 15

Solution-Phase Exfoliation of Graphene by High Shear Mixing: For widespread and cost-effective application in printed electronics, graphene must be produced on a large scale with a method compatible with solution-phase processing. Scalable and efficient methods for particle size reduction, such as high shear mixing, are widely used in industrial processes and present an attractive alternative for the exfoliation of graphene. This technique can be employed for the exfoliation of graphene, in conjunction with ethyl cellulose (EC) dispersant chemistry, for gravure and screen printing.

As shown in FIG. 20, a commercially-available high shear mixer is capable of producing large volumes of graphene dispersion, with a high graphene concentration even after an extended centrifugation step. In addition, the graphene concentration does not saturate for mixing times up to 4 hours, a promising characteristic for robust scaling. The centrifugation step affects both the graphene yield and the size distribution of graphene particles, and is therefore important to optimize. As shown in FIG. 21, larger particles are retained with a lower centrifuge speed. In addition, it is seen that the different centrifuge rates, while producing different particle size distributions, produce films with largely similar conductivity. Therefore, the chemistry appears to provide for fairly robust electrical properties, potentially easing process constraints and enabling high-resolution patterning of small flakes without substantially compromising electrical conductivity.

In addition to the graphene particle size, the graphene: polymer ratio has a role in the composite films. The amount of EC dispersant impacts the efficacy of graphene exfoliation by shear mixing, as shown in FIG. 22. In addition, varying this parameter allows for straightforward tuning of the graphene:EC ratio in the composite powder, a factor to be considered for reproducible performance. The fraction of polymer dispersant affects the ink viscosity, dispersion stability, deposited film thickness, and the efficacy of alternative annealing methods, as discussed in the following example.

Example 16

Application of Photonic Annealing to Graphene Patterns: Photonic annealing was investigated as an alternative post-processing method to provide rapid annealing of graphene patterns compatible with a broad range of plastic substrates. Thermal annealing of graphene/EC films limits their application on certain temperature-sensitive substrates, such as PET. However, photonic annealing uses a rapid, intense light pulse to selectively heat the graphene/EC—but not the substrate—due to differences in optical absorption.

To optimize the effectiveness of photonic annealing, graphene/EC films were printed from inks with varying graphene:EC ratio. The sheet resistance of the films following thermal and photonic annealing was comparatively measured for a range of annealing conditions, as shown in FIG. 23. For the film containing 25% wt. graphene, photonic annealing yields a sheet resistance approximately 70% greater than the optimized thermal annealing result, while maintaining compatibility with PET substrates limited to a maximum temperature of approximately 150° C. For the film containing 50% wt. graphene, the sheet resistance following photonic annealing is slightly lower than the optimal thermal annealing result. The limitation of graphene/EC material on certain substrates can, therefore, be circumvented through photonic annealing, broadening the opportunities for the integration of printed graphene with diverse substrate and related device materials.

Example 17

As discussed above (e.g., see examples 1-4) an ink composition of this invention, for use in gravure printing, can be prepared to comprise about 5-about 10% w/v solids, with best printing generally observed at 10%. Such inks can yield a dried film with ~15% graphene and ~85% ethyl cellulose (by weight). However, a gravure ink comprising ~10% solids can have about 30-about 40% graphene and about 60-about 70% ethyl cellulose. Regardless, typical viscosities of such ink compositions with such solids contents, for gravure printing, range from about 0.1-about 1.0 Pa·s.

Example 18

An ink composition for use in screen printing (e.g., see examples 10-12) can be prepared to comprise about 20% w/v solids, to provide a dry film of about 40% graphene and about 60% ethyl cellulose (by weight). Alternatively, an ink of about 20% w/v solids can have about 50% graphene/50% ethyl cellulose, but the graphene:ethyl cellulose ratio could be increased as desired. Regardless, viscosities of about 5-about 50 Pa·s are generally useful, although screen printing is a fairly robust process and a viscosity within the range of about 1-about 100 Pa·s can be employed.

Example 19

While compositions of this invention can be prepared using one or more terpineols, various other ink solvents can be used including but not limited to alcohols, such as ethanol, and glycol ethers, such as di(ethylene glycol)methyl ether. Other suitable ink solvents will be understood by those skilled in the art made aware of this invention.

We claim:
1. A gravure printing graphene ink composition, said composition comprising non-oxidized graphene, a hydrophobic fluid component and an ethyl cellulose, said hydrophobic fluid component comprising a component being alkanes or a combination of chloroform and alkanes, said composition comprising a graphene-ethyl cellulose solid concentration of 5% to 10% w/v and a viscosity of 0.1 to 1.0 Pa·s.

2. The graphene ink composition of claim 1 printed on a substrate, said composition comprising a graphene content of 30 to 40 wt %.

3. A screen printing graphene ink composition, said composition comprising non-oxidized graphene, a hydrophobic fluid component and an ethyl cellulose, said hydrophobic fluid component comprising a component being alkanes or a combination of chloroform and alkanes, said composition comprising a graphene-ethyl cellulose solid concentration of 10% to 20% w/v and a viscosity of 5 to 100 Pa·s.

4. The composition of claim 3 printed on a substrate, said composition comprising a graphene content of at least 50 wt %.

5. The composition of claim 2 comprising an annealation product of said graphene and said ethyl cellulose.

6. The composition of claim 4 comprising an annealation product of said graphene and said ethyl cellulose.

7. A gravure printing graphene ink composition, said composition consisting essentially of non- oxidized graphene, a hydrophobic fluid component and an ethyl cellulose, said hydrophobic fluid component comprising a component selected from chloroform, alkanes and a combination thereof, said composition comprising a graphene-ethyl cellulose solid concentration of 5% to 10% w/v and a viscosity of 0.1 to 1.0 Pa·s.

8. The graphene ink composition of claim 7 printed on a substrate, said composition comprising a graphene content of 30 to 40 wt %.

9. A screen printing graphene ink composition, said composition consisting essentially of non-oxidized graphene, a hydrophobic fluid component and an ethyl cellulose, said hydrophobic fluid component comprising a component selected from chloroform, alkanes and a combination thereof, said composition comprising a graphene-ethyl cellulose solid concentration of 10% to 20% w/v and a viscosity of 5 to 100 Pa·s.

10. The composition of claim 9 printed on a substrate, said composition comprising a graphene content of at least 50 wt %.

11. A gravure printing graphene ink composition comprising a composite of graphene and an ethyl cellulose, and a hydrophobic fluid component comprising an ink solvent and a dispersion solvent, said hydrophobic fluid component capable of providing said ink composition upon removal of said dispersion solvent, said ink solvent being alkanes or a combination of chloroform and alkanes, said composition comprising a graphene-ethyl cellulose solid concentration of 5% to 10% w/v and a viscosity of 0.1 to 1.0 Pa·s.

12. The graphene ink composition of claim 11 printed on a substrate, said composition comprising a graphene content of 30 to 40 wt %.

13. A screen printing graphene ink composition comprising a composite of graphene and an ethyl cellulose, and a hydrophobic fluid component comprising an ink solvent and a dispersion solvent, said hydrophobic fluid component capable of providing said ink composition upon removal of said dispersion solvent, said ink solvent being alkanes or a combination of chloroform and alkanes, said composition comprising a graphene-ethyl cellulose solid concentration of 10% to 20% w/v and a viscosity of 5 to 100 Pa·s.

14. The composition of claim 13 printed on a substrate, said composition comprising a graphene content of at least 50 wt %.

* * * * *